(12) United States Patent
Uchibori

(10) Patent No.: US 6,841,477 B1
(45) Date of Patent: Jan. 11, 2005

(54) METAL INTERCONNECTION, SEMICONDUCTOR DEVICE, METHOD FOR FORMING METAL INTERCONNECTION AND METHOD FOR FABRICATING SEMICONDUCTOR DEVICE

(75) Inventor: Chihiro Uchibori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/648,750

(22) Filed: Aug. 28, 2000

(30) Foreign Application Priority Data

| Aug. 27, 1999 | (JP) | 11-240866 |
| Jun. 6, 2000 | (JP) | 2000-169361 |
| Aug. 4, 2000 | (JP) | 2000-236744 |

(51) Int. Cl.$^7$ .............................................. H01L 21/44
(52) U.S. Cl. ...................... 438/687; 438/533; 438/618; 438/622; 438/624; 438/627; 438/628; 438/629; 438/128; 438/637; 257/211; 257/750; 257/751; 257/753
(58) Field of Search ................................ 438/687–692, 438/697, 533, 128, 618–637; 257/211, 750–53

(56) References Cited

U.S. PATENT DOCUMENTS

| 4,751,349 A | * | 6/1988 | Kim et al. ................... 174/68.5 |
| 5,539,256 A | * | 7/1996 | Mikagi ......................... 257/763 |
| 5,595,937 A | | 1/1997 | Mikagi |
| 5,677,244 A | * | 10/1997 | Venkatraman ................ 437/198 |
| 5,714,418 A | * | 2/1998 | Bai et al. ..................... 438/627 |
| 5,858,873 A | * | 1/1999 | Vitkavage et al. ........... 438/626 |
| 5,895,231 A | * | 4/1999 | Choi et al. ................... 438/106 |
| 5,939,788 A | * | 8/1999 | McTeer ........................ 257/751 |
| 5,946,600 A | * | 8/1999 | Hurwitz et al. .............. 438/688 |
| 6,022,808 A | * | 2/2000 | Nogami et al. .............. 438/694 |
| 6,028,359 A | * | 2/2000 | Merchant et al. ............ 257/750 |
| 6,028,362 A | * | 2/2000 | Omura ......................... 257/774 |
| 6,249,055 B1 | * | 6/2001 | Dubin .......................... 257/758 |
| 6,284,656 B1 | * | 9/2001 | Farrar .......................... 438/687 |

OTHER PUBLICATIONS

Berti et al. "Characterization of a PVD–TiN as the diffusion barrier/adhesion promoter . . . " Sematech Research p. 118–119.*

Moussavi et al. "Comparison of barrier materials and deposition process ofr copper integration" IEEE IITC 98–295 0–7803–4285–2/98 p. 295–297.*

Baumann et al. "Tin/W double layers as a barrier system for use in Cu metalization" Materials for advanced metallization pg. 128–129.*

Kwak, et al. "Improvement of Ta Diffusion barrier performance in Cu Metallization by Insertion of a thin Zr Layer into Ta Film" Appl. Phys., Lett. vol. 72, pp. 2832–2834.

* cited by examiner

Primary Examiner—Matthew Smith
Assistant Examiner—Granvill D. Lee, Jr.
(74) Attorney, Agent, or Firm—Arent Fox PLLC

(57) ABSTRACT

A semiconductor device comprising: a base substrate including a semiconductor substrate 10 and a semiconductor element formed on the semiconductor substrate 10; an insulation film 22, 24, 26 formed on the base substrate having an opening 30, 32; and a metal interconnection 42 formed buried in the opening 30, 32 including: a barrier layer 34 formed on an inside wall and a bottom of the opening 30, 32; an adhesion layer 36 containing zirconium formed on the barrier layer 34; and a metal interconnection material 38, 40 containing copper as a main component formed on the barrier layer 36. Whereby the peeling of the copper interconnection in the fabrication process can be prevented. The electro migration resistance and stress migration resistance of the copper interconnection can be further improved.

22 Claims, 24 Drawing Sheets

METAL INTERCONNECTION, SEMICONDUCTOR DEVICE, METHOD FOR FORMING METAL INTERCONNECTION AND METHOD FOR FABRICATING SEMICONDUCTOR DEVICE

CROSS-REFERENCE TO RELATED APPLICATIONS

This application is based upon and claims priority of Japanese Patent Applications Nos. Hei 11-240866, 2000-169361, and 2000-236744, all filed, the contents being incorporated herein by reference.

BACKGROUND OF THE INVENTION

The present invention relates to an interconnection used in semiconductor devices, etc., more specifically to an interconnection which is suitably applicable to metal interconnections, semiconductor devices, methods for forming the metal interconnection and methods for fabricating the semiconductor devices which use Cu (copper) for lower resistivity.

As semiconductor integrated circuits have been recently higher integrated, elements formed on the semiconductor substrates and interconnections connecting the elements have been increasingly micronized. Accordingly, characteristics and reliability required of the interconnections have become stricter. More reliable interconnection materials having lower resistivity, electro migration resistance and stress migration resistance, etc. are needed.

In such background, Cu, which is superior to Al (aluminum) in resistivity and electro migration resistance, is noted as an interconnection material in place of Al, which has been conventionally widely used as an interconnection material, and has been increasingly practically used. In forming such copper interconnection on the semiconductor substrate, a fabrication process so-called damascene method is used to bury copper interconnection in the insulation film.

With reference to FIGS. 24A–24D, the method for fabricating a copper interconnection by damascene method will be explained. FIGS. 24A–24D are diagrammatic sectional views showing a method for fabricating a copper interconnection by damascene method on an inter-layer insulation film 101 formed above a semiconductor substrate in the sequence of the forming steps.

First, as shown in FIG. 24A, an interconnection groove 102 is formed in the inter-layer insulation film 101 formed on the semiconductor substrate (not shown), by photolithography and dry etching following the photolithography.

Then, as shown in FIG. 24B, a refractory metal film 103 is formed, covering the inter-layer insulation film 101 and the inside wall of the interconnection groove 102. The refractory metal film 103 is a barrier film which prevents Cu as the interconnection material from reacting with the inter-layer insulation film 101 of silicon oxide film, etc. and diffusing so as to suppress deterioration of device characteristics. Then, a Cu film 104 as a seed layer is formed by CVD method or others, covering the refractory metal film 103 so as to efficiently form the Cu film 105 to be formed by plating.

Then, as shown in FIG. 24C, a Cu film 105 is formed by sputtering method, so as to fill the interconnection groove 102. Thus, the interconnection groove 102 is filled with the Cu film 105 with the Cu film 105 formed thick in the region other than the interconnection groove 102.

Next, as shown in FIG. 24D, the Cu films 104, 105, and the refractory metal film 103 in the region other than the interconnection groove 102 are polished back by CMP (Chemical Mechanical Polishing) method. Thus, the interconnection film of the refractory metal film 103, the Cu films 104, 105 buried in the interconnection groove 102 is completed.

In thus using Cu as an interconnection material, because Cu produces no halogenide of high vapor pressure, dry etching cannot be used in the patterning. The interconnection must be formed by damascene method including the polishing step by CMP method.

However, the CMP method performed for removing the Cu films 104, 105 on the inter-layer insulation film 101 is a mechanical polishing method, and the Cu films 104, 105 are often peeled from the interconnection groove 102 by the mechanical stress.

Especially, the refractory metal film 103 is formed of TaN (Tantalum Nitride) or others, which has low reactivity with the Cu films 104, 105 so that the refractory metal film 103 can function as a barrier film. The refractory metal film 103 can prevent diffusion of the Cu into the inter-layer insulation film while cannot ensure sufficient adhesion to the Cu film 104. Accordingly, when the mechanical polishing is performed by CMP method, a stress is exerted to the interface between the Cu films 104, 105 and the refractor metal film 103 by a force applied to the Cu films 104, 105, and often the Cu films 104, 105 peel from the refractory metal film 103. When the adhesion between the refractory metal film 103 and the Cu film 104 is insufficient, the resistance to the stress migration cannot be sufficiently ensured.

When large current flows in the Cu films 104, 105, migration of atoms more tends to occur near the interface between the Cu film 104 and the refractory metal film 103 rather than inside of the interconnection film. However, because of poor adhesion between the refractory metal film 103 and the Cu film 104, there is a limit to the improvement of the electro migration resistance near the interface.

Notwithstanding the good advantage that the interconnection material using Cu can decrease resistivity and can improve electro migration resistance, it is essential to form the barrier layer, and sufficient adhesion cannot be ensured near the interface between the Cu film and the barrier layer of low reactivity with Cu. Accordingly, when the mechanical polishing is preformed by CMP method, the Cu films 104, 105 often peel off. The adhesion with respect to the refractory metal film 103 cannot be increased, and accordingly there is a limit to further improvement of the electro migration resistance and the stress migration resistance.

SUMMARY OF THE INVENTION

An object of the present invention is to provide a metal interconnection, a semiconductor device, a method for forming a metal interconnection and a method for fabricating a semiconductor device which, when the interconnection film is formed of Cu, can prevent the Cu interconnection from peeling off, and can improve electro migration resistance and stress migration resistance, whereby higher reliability can be obtained.

In order to improve the adhesion between the copper interconnection and the barrier layer, it is considered to dispose between the interconnection and the barrier layer an adhesion layer of a material having good adhesion to both the interconnection and the barrier layer. Similarly, in order to improve the adhesion between the barrier layer and the inter-layer insulation film, it is considered to dispose between the barrier layer and the inter-layer insulation film an adhesion layer of a material having good adhesion to both the barrier layer and the inter-layer insulation film.

Here, the adhesion layer disposed between the copper interconnection and the barrier layer will be considered. Important characteristics required of the adhesion layer are not only that the adhesion layer has good adhesion to both the copper interconnection and to the barrier layer, but also that elements forming the adhesion layer do not diffuse into the copper interconnection to thereby raise the low resistivity of the copper interconnection, which is a merit of copper interconnections.

From these viewpoints, the inventors of the present application have made earnest studies and have found for the first time that Zr (zirconium) is a material which, suitably for adhesion layers, has good adhesion to the copper interconnection and the generally used barrier layers, and little raises the resistivity of the copper interconnection.

Reasons for Zr being suitable as a material of the adhesion layer will be explained below.

In order to improve the adhesion between the copper interconnection layer and the adhesion layer, and between the adhesion layer and the barrier layer, it is necessary to diffuse materials forming the adhesion layer into the copper interconnection and the barrier layer to thereby make interface states between both layers compatible.

On the other hand, if all constituent elements forming the adhesion layer diffuse into the copper interconnection or the barrier layer, it substantially makes no difference from the case that the copper interconnection layer is provided on the barrier layer, and the adhesion is not improved.

Generally, when other elements are solid-solved in Cu, the resistivity is increased. Accordingly, when elements of the adhesion layer are much diffused in Cu, the merit of the copper interconnection, the low resistivity, cannot be fully utilized.

Accordingly, when a material is selected to form the adhesion layer, the above-described points must be sufficiently considered. Elements which do not much increase the resistivity of Cu when introduced into Cu are Zr (zirconium), Cd (cadmium), Zn (zinc), Ag (silver), Pb (lead), Sn (tin), Al (aluminum), etc. These materials are less effective in the stated order to increase the resistivity.

On the other hand, in order that the adhesion layer functions, it is necessary that even after the interface is made compatible as described above by a heat treatment or others, the adhesion layer remains between the copper interconnection and the barrier layer to retain the adhesion between both. Accordingly, it is preferable that a material forming the adhesion layer is one that has low solid solubility limit in Cu and all constituent elements of which do not diffuse into the Cu interconnection, and which can keep resistivity increase of copper low.

Elements having low solid solubility limit in Cu are, e.g., Ag, B (boron), Ba (barium), Bi (Bismuth), Ca (calcium), Cd, Ce (Cerium), Dy (Dysprosium), Er (Erbium), Eu (Europium), Gd (Gadolinium), Hf (Hafnium), In (Indium), La (Lanthanum), Mo (Molybdenum), Nb (Niobium), Nd (Neodymium), Pb, Pr (Praseodymium), Se (Selenium), Sm (Samarium), Sr (Strontium), Te (Tellurium), Th (Thorium), Tl (Thallium), V (Vanadium), Y (Yttrium), Yb (Ytterbium), Zr, etc.

The solid solubility limit of the above-described elements, which are less effective to increase the resistivity of Cu when introduced into Cu are as follows: Zr, 0.15 wt %; Cd, 0.5 wt %; Zn, 39 wt %; Ag, 0.8 wt %; Pb, 0.09 wt %; Ni, a whole wt %; Sn, 11–15 wt %; and Al, 9 wt %.

Accordingly, when an optimum material is selected out of the above-described materials, it is preferable that, as the adhesion film, Zr film having the low solid solubility limit and is not effective to increase the resistivity of Cu is selected. The use of film containing Zr, e.g., ZrN (zirconium nitride) film will produce the same effect. The adhesion layer of nitride film can have the function of a barrier layer.

In a case that the adhesion layer is formed of Zr, in the interface between the barrier layer and the adhesion layer, constituent elements of the barrier layer and the adhesion layers diffuse into each other by a heat treatment, whereby the adhesion between both is improved. 0.1 Zr has good adhesion to silicon oxide film, etc. of the inter-layer insulation film. The adhesion layer of Zr can function between the inter-layer insulation film and the barrier layer.

In consideration of the typical film structure and process, although the condition varies depending on film structures and the later heat treatment, etc. and cannot be generally defined, it is preferable that a solid solubility limit of the material forming the adhesion layer in Cu is below 20 wt %. In order to utilizing the low resistance value of Cu while applying Cu to the interconnection layer, a resistivity increase of Cu due to an impurity introduced in Cu must be depressed to be below 19.8%.

From such viewpoint, although the inventors of the present application has not studied in details, other materials which have low solid solubility limit in Cu and are not effective to increase the resistivity of Cu, e.g., Cd, Ag, Pb, etc. may be usable as the adhesion layer.

As processing for making interface between the adhesion layer and the copper interconnection compatible to increase the adhesion, for example, the adhesion layer of Zr is deposited in amorphous state, and the seed layer is deposited by a film forming technique, e.g., sputtering method or others, in which film components have high energy. When the seed layer is formed by such film forming technique, part of Cu forming the seed layer intrudes into the adhesion layer, whereby the adhesion between the seed layer and the adhesion layer is improved.

It is possible that after the seed layer is formed, part of Zr forming the adhesion layer is diffused toward the seed layer. For example, a low-temperature heat treatment of about 200° C. or a several second rapid thermal treatment of about 500° C. is made to diffuse part of Zr of the adhesion layer to thereby improve the adhesion between the adhesion layer and the seed layer.

Otherwise, it is possible that a heat treatment is made until part of Zr of the adhesion layer reaches a solid solubility limit in the seed layer. For example, a 30 minute-heat treatment of 300° C. can be used. Zr has low solid solubility limit in the Cu film, and even when the heat treatment is made until the solid solubility limit, the effect of increasing the resistivity of Cu is little. When Zr is solid-solved to the solid solubility limit, more of the Zr does not diffuse toward the Cu, whereby the effect of making resistivity changes of the copper interconnection small by later heat treatments and different processes. In this case, it is necessary to control film thickness of the seed layer and the adhesion layers so that Zr film remains in the interface between the seed layer and the barrier layer still after the heat treatment.

Adhesion changes and film resistance changes occurring when the adhesion layer of Zr film and the seed layer of Cu film are deposited on the barrier layer of TaN are shown in TABLE 1 and FIG. 1. Film thicknesses of the adhesion layer and the seed layer were totally 200 nm constant, and film thickness ratios between the Zr film and Cu film were changed.

TABLE 1

| Thickness of Seed Layer | Thickness of Adhesion Layer | Zr/Cu Ratio | Critical Stress [kgf] |
|---|---|---|---|
| Cu film 200 nm | None | 0 | 10.0 |
| Cu film 198 nm | Zr film 2 nm | 1/99 | 12.5 |
| Cu film 195 nm | Zr film 5 nm | 1/39 | 12.5 |
| Cu film 190 nm | Zr film 10 nm | 1/19 | 15.0 |

As shown in TABLE 1, when a film thickness ratio of Zr:Cu is 1:99 or more, it is found that a critical stress which is an index of the adhesion is increased in comparison with that of the case the adhesion layer of Zr is not formed.

When a film thickness ratio of Zr:Cu is 1:99, a Zr concentration in Cu is 0.15 wt %, which is substantially the solid solubility limit. As shown in FIG. 1, it is found that although the film thickness ratio of Zr increases, resistivity changes of the copper interconnection are small.

In FIG. 1, a Control that Sn film and Cu film are formed in a total film thickness of 300 nm, and a Control that Pd film and Cu film are formed in a total film thickness of 300 nm show the same results. As film thickness of Sn and Pd increase, the resistivity of Cu increases. It is found that Sn and Pd are less effective to depress resistivity increase of Cu than Zr. For the relationships between the Sn film and the Cu film, data described in C.-K. Hu et al., Thin Solid Films, 262 (1995) 84, C.-K. Hu et al., J. Electrochem. Soc., 143 (1996) 1001, and Y. S. Gong et al., Appl. Surf. Soc., 92 (1996) 355 were used. For the relationships between the Pd film and the Cu film, the data described in C. W. Park et al., Thin Solid Films, 226 (1993) 238 were used.

Although not shown, a sectional structure of a sample having a film thickness ratio between Zr:Cu of 1:99 was observed by a transmission electron microscope. It was found that Zr which was not solid solved in the Cu film resided in the interface between the seed layer and the barrier layer, and the residual Zr and TaN diffused in each other, forming the interface of high adhesion.

Island-shaped structures of a Cu—Zr alloy (which are also called as islands of a Cu—Zr alloy in this specification) are provided between the seed layer and the barrier layer, whereby improved adhesion can be obtained. Because of the island-shaped structures of a Cu—Zr alloy, microscopically, rugged surface formed by the island-shaped structures mechanically mesh the barrier layer and the adhesion layer with each other, whereby even when a stress is applied to the interface between the barrier layer and the adhesion layer, the peeling of the copper interconnection can be prevented. The adhesion layer is formed of a material containing Zr, whose adhesion to the Cu and the refractory metal material generally used as the barrier film is high, whereby the constituent elements diffuse into each other in the interface between the adhesion layer and the Cu interconnection or the barrier layer and the adhesion between the Cu film and the barrier layer can be improved. Thus, the mechanical mesh by means of the rugged surface formed by the island-shaped structures of a Cu—Zr alloy film, and the adhesion by means of the adhesion film are both used, whereby the adhesion between the copper interconnection and the barrier layer can be synergetically made sturdy.

That is, the above-described object is achieved by a metal interconnection buried in an insulation film comprising: a barrier layer formed on the insulation film; an adhesion layer containing zirconium formed on the barrier layer; and an interconnection material containing copper as a main component formed on the adhesion layer.

The above-described object is also achieved by a metal interconnection buried in an insulation film comprising: an adhesion layer containing zirconium formed on the insulation film; a barrier layer formed on the adhesion layer; and an interconnection material containing copper as a main component formed on the barrier layer.

The above-described object is also achieved by a metal interconnection buried in an insulation film comprising: a barrier layer formed on the insulation film; an adhesion layer containing a metal material having a solid solubility limit of not more than 20 wt % in copper and a resistivity increase of not more than 19.8% when solved in copper formed on the barrier layer; and an interconnection material containing copper as a main component formed on the adhesion layer.

The above-described object is also achieved by a semiconductor device comprising: a base substrate having a semiconductor substrate and a semiconductor element formed on the semiconductor substrate; an insulation film formed on the base substrate, the insulation film having an opening; and a metal interconnection formed buried in the opening including: a barrier layer formed on an inside wall and a bottom of the opening; an adhesion layer containing zirconium formed on the barrier layer; and a metal interconnection material containing copper as a main component formed on the adhesion layer.

The above-described object is also achieved by a semiconductor device comprising: a base substrate having a semiconductor substrate and a semiconductor element formed on the semiconductor substrate; an insulation film formed on the base substrate, the insulation film having an opening; and a metal interconnection formed buried in the opening including; an adhesion layer containing zirconium formed on an inside wall and a bottom of the opening; a barrier layer formed on the adhesion layer; and a metal interconnection material containing copper as a main component formed on the barrier layer.

The above-described object is also achieved by a method for forming a metal interconnection buried in an insulation film, comprising the steps of: forming a barrier layer on the insulation film; forming an adhesion layer containing zirconium on the barrier layer; and forming an interconnection material containing copper as a main component on the adhesion layer.

The above-described object is also achieved by a method for forming a metal interconnection buried in an insulation film, comprising the steps of: forming an adhesion layer containing zirconium on the insulation film; forming a barrier layer on the adhesion layer; and forming an interconnection material containing copper as a main component on the barrier layer.

The above-described object is also achieved by a method for fabricating a semiconductor device comprising the steps of: forming an insulation film on the base substrate having a semiconductor substrate and a semiconductor element formed on the semiconductor substrate; selectively removing the insulation film to form an opening in the insulation film; forming a barrier layer on the insulation film and a region where the opening is formed; forming a first adhesion layer containing zirconium on the barrier layer; forming an interconnection material containing copper as a main component on the first adhesion layer so as to fill the opening; and removing the interconnection material, the first adhesion layer and the barrier layer by polishing the same until the insulation film is exposed to form the metal interconnection of the interconnection material, the first adhesion layer and the barrier layer buried in the opening.

The above-described object is also achieved by a method for fabricating a semiconductor device comprising the steps of: forming an insulation film on the base substrate having a semiconductor substrate and a semiconductor element formed on the semiconductor substrate; selectively removing the insulation film to form an opening in the insulation film; forming an adhesion layer containing zirconium on the insulation film and a region where the opening is formed; forming a barrier layer on the adhesion layer; forming an interconnection material containing copper as a main component on the barrier layer so as to fill the opening; and removing the interconnection material, the barrier layer and the adhesion layer by polishing the same until the insulation film is exposed to form the metal interconnection of the interconnection material, barrier layer and the adhesion layer buried in the opening.

DETAILED DESCRIPTION OF THE INVENTION

[A First Embodiment]

The semiconductor device and the method for fabricating the same according to a first embodiment of the present invention will be explained with reference to FIGS. 2, 3A–3D, 4A–4C, 5A–5C, 6A–6B, 7A–7B, 8A–8B and 9A–9B.

Figure 1:
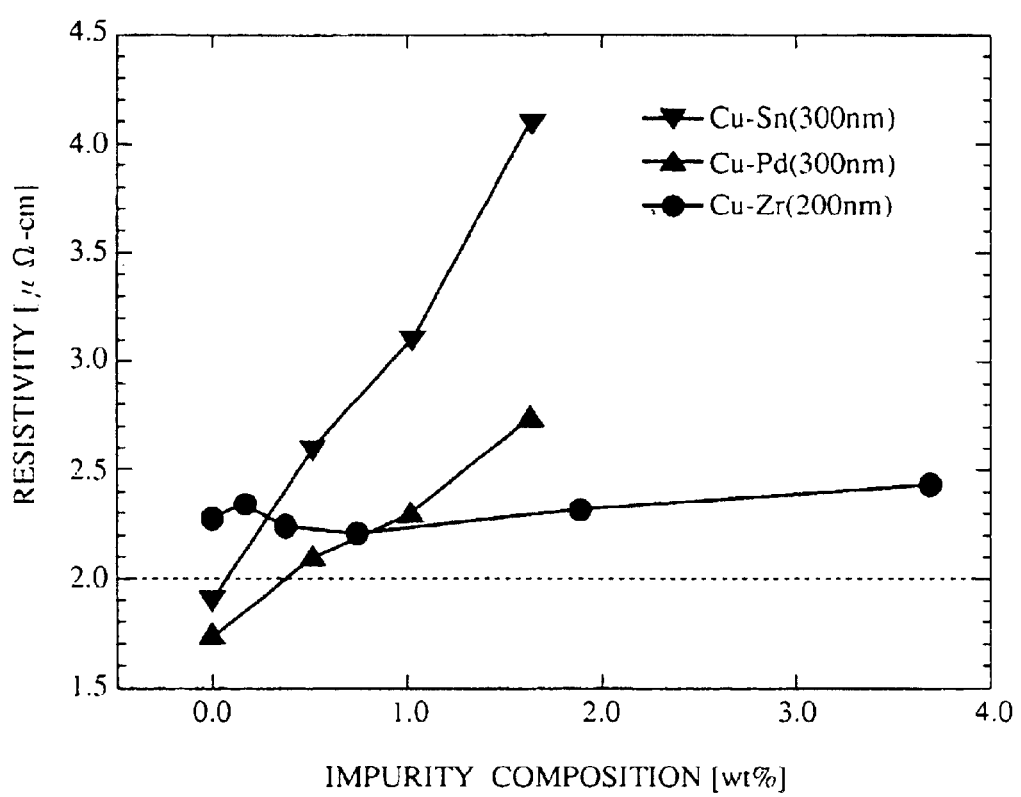
FIG. 1 is a graph of resistivity changes given when film thickness ratios of Cu film to Zr film, Cu film to Sn film and Cu film to Pd film.
Figure 2:
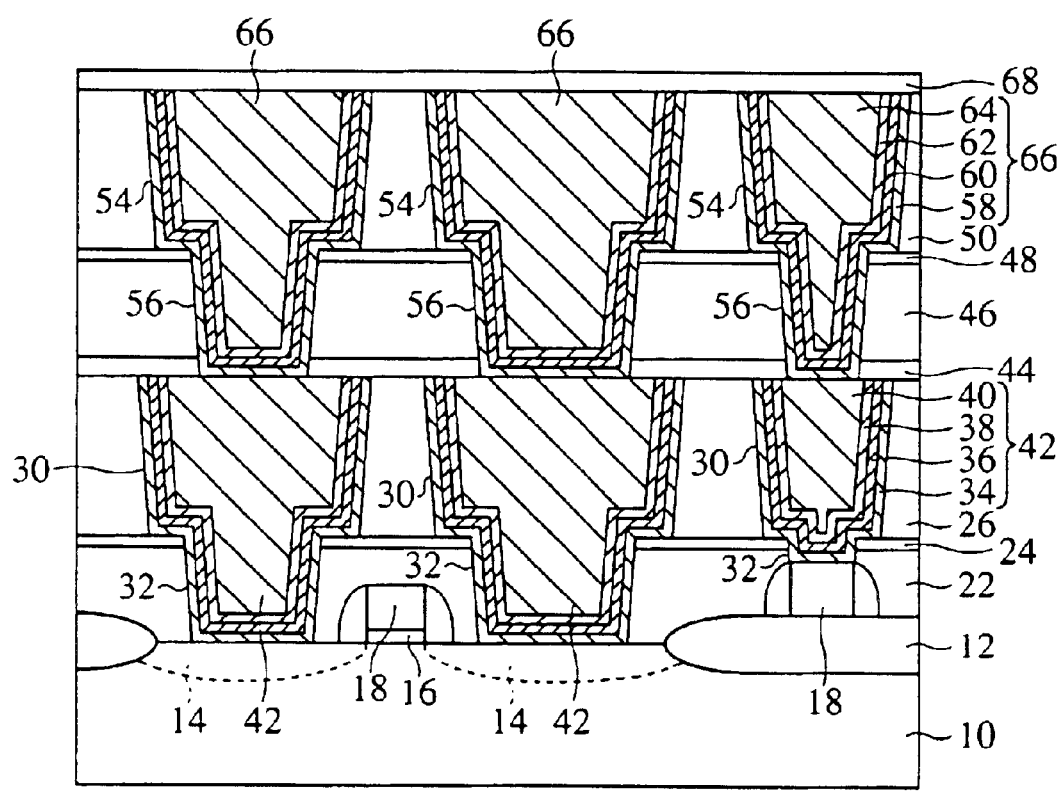
FIG. 2 is a diagrammatic view of the semiconductor device according to a first embodiment and a second embodiment of the present invention.

FIG. 2 is a diagrammatic sectional view of the semiconductor device according to the present embodiment, which shows a structure thereof. FIGS. 3A–3D, 4A–4C, 5A–5C, 6A–6B, 7A–7B, 8A–8B and 9A–9B are sectional views of the semiconductor device according to the present embodiment in the steps of the method for fabricating the same, which explain the method.

First, the structure of the semiconductor device according to the present embodiment will be explained with reference to FIG. 2.

A MOS transistor including a source/drain diffused layer 14 and a gate electrode 18 is formed in a device region of a silicon substrate 10 defined by a device isolation film 12.

On the silicon substrate 10 with the MOS transistor formed on, there are formed an inter-layer insulation film 22, a stopper film 24 and an inter-layer insulation film 26 the one on the other. Via holes 32 which reach the source/drain diffused layer 14 and the gate electrode 18 are formed in the inter-layer insulation film 22 and the stopper film 24. Interconnection grooves 30 are formed in the inter-layer insulation film 26 in regions containing the regions where the via holes 32 are formed. An interconnection layer 42 formed of a barrier layer 34 of TaN film, an adhesion layer 36 of Zr film, a Cu film 38 as a seed layer and a Cu film 40 is buried in the via holes 32 and the interconnection grooves 30.

On the inter-layer insulation film 26 with the interconnection layer 42 buried in, there are formed an interconnection protecting film 44, an inter-layer insulation film 46, a stopper film 48 and an inter-layer insulation film 50 the one on the other. Via holes 56 arriving at the interconnection layer 42 are formed in the interconnection protecting film 44, the inter-layer insulation film 46 and the stopper film 48. Interconnection grooves 54 are formed in the inter-layer insulation film 50 in the regions containing the regions where the via holes 56 is formed. An interconnection layer 66 formed of a barrier layer 58 of TaN film, an adhesion layer 60 of Zr film, a Cu film 62 as a seed layer and a Cu film 64 is buried in the via holes 56 and the interconnection grooves 54.

An interconnection protecting film 68 is formed on the inter-layer insulation film 50 with the interconnection layer 66 buried in.

The semiconductor device according to the present embodiment has such structure.

The semiconductor device according to the present embodiment is characterized in that the adhesion layer 36 of Zr film is formed between the barrier layer and the Cu film 38 as the seed layer, and the adhesion film 60 is formed between the barrier layer 58 and the Cu film 62 as the seed layer. Because of the adhesion layers 36, 60 of Zr film thus arranged, adhesion between the barrier layers 34, 58 and the adhesion layers 36, 60, that between the adhesion layers 36, 60 and the Cu films 38, 62 as the seed layers can be improved. Accordingly the semiconductor device according to the present embodiment has improved adhesion in comparison with the conventional semiconductor devices.

Next, the method for fabricating the semiconductor device according to the present embodiment will be explained with reference to FIGS. 3A–3D, 4A–4C, 5A–5C, 6A–6B, 7A–7B, 8A–8B and 9A–9B.

First, a silicon substrate 10 is locally oxidized by, e.g., the usual LOCOS method to form the device isolation film 12 which defines a device region.

Figure 3A:
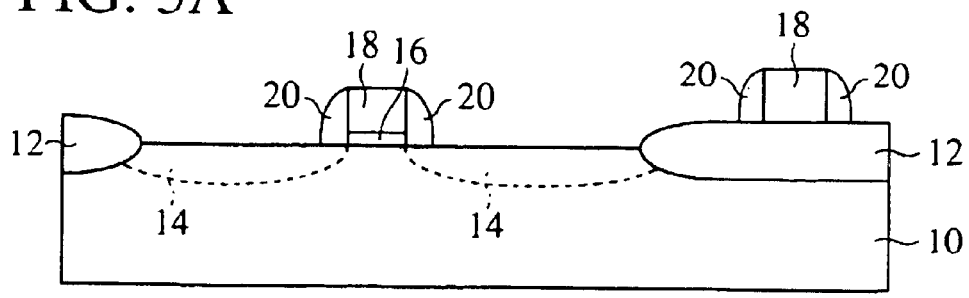
FIGS. 3A–3D, 4A–4C, 5A–5C, 6A–6B, 7A–7B, 8A–8B and 9A–9B are sectional views of the semiconductor device according to the fist and the second embodiments of the present invention in the steps of the method for fabricating the same, which explain the method.

Then, in the same way as in the usual MOS transistor fabrication process, a MOS transistor including the source/drain diffused layer 14, a gate insulation film 16, the gate electrode 18 and a sidewall insulation film 20 is fabricated (FIG. 3A).

Figure 3B:
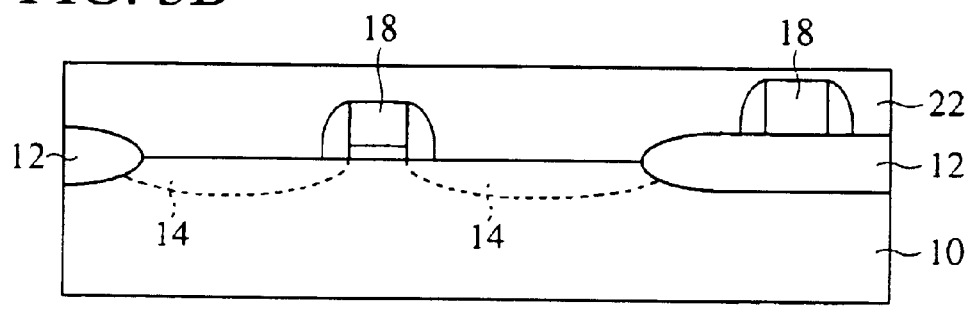

Next, an about 500–700 nm-thick silicon oxide film id deposited on the entire surface by CVD method, and then the surface is polished by, e.g., CMP method to be planarized. Thus, the inter-layer insulation film 22 of the silicon oxide film having the surface planarized is formed (FIG. 3B).

Figure 3C:
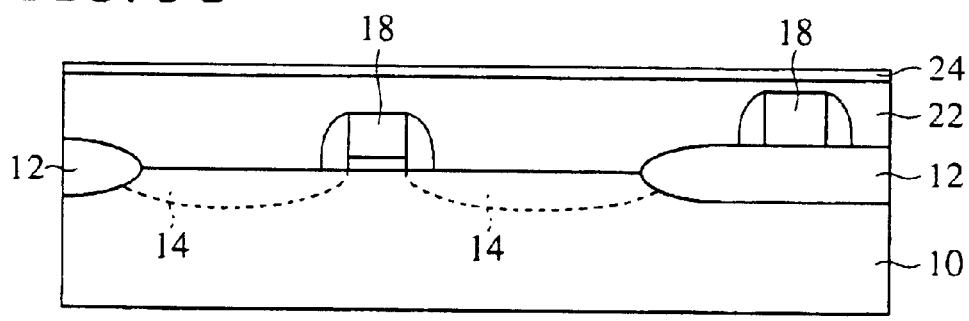

Then, an about tens nm-thick silicon nitride film is deposited on the entire surface by, e.g., CVD method. Thus, the stopper film 24 of the silicon nitride film is formed (FIG. 3C).

Figure 3D:
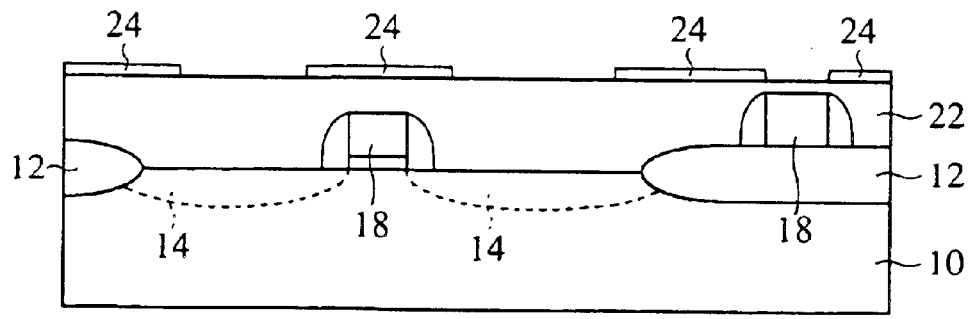

Then, the stopper film 24 in the regions where the via holes for interconnecting the interconnection layer to be formed above and elements formed on the silicon substrate 10 are to be formed is removed by the usual lithography and etching (FIG. 3D). FIG. 3 exemplifies the case the via hole are opened on the source/drain diffused layer 14 and on the gate electrode 18 on the right side as viewed in FIG. 3D.

Figure 4A:
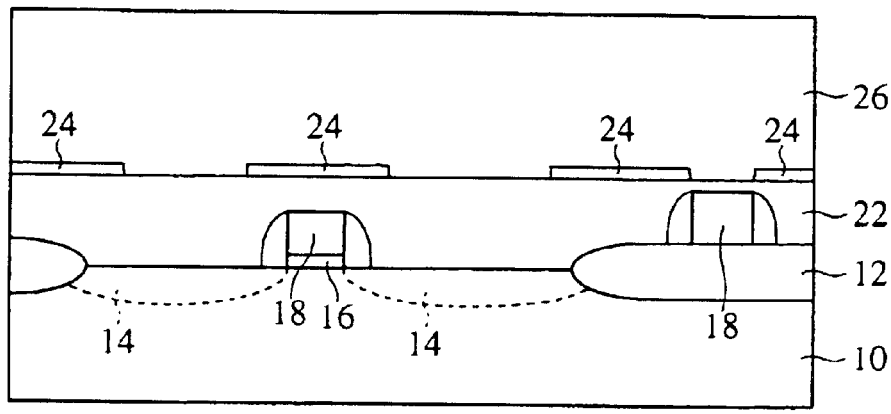

Next, an about 400 nm-thick silicon oxide film is deposited on the entire surface by, e.g., CVD method to form the inter-layer insulation film 26 of the silicon oxide film (FIG. 4A).

Figure 4B:
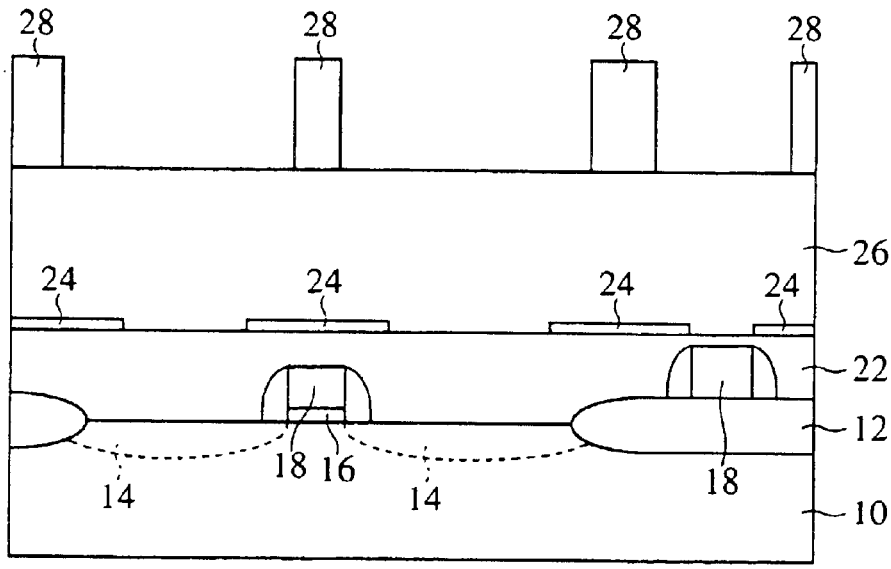

Then, a resist film 28 having an opening pattern corresponding to the interconnection layer to be formed is formed by the usual lithography (FIG. 4B).

Figure 4C:
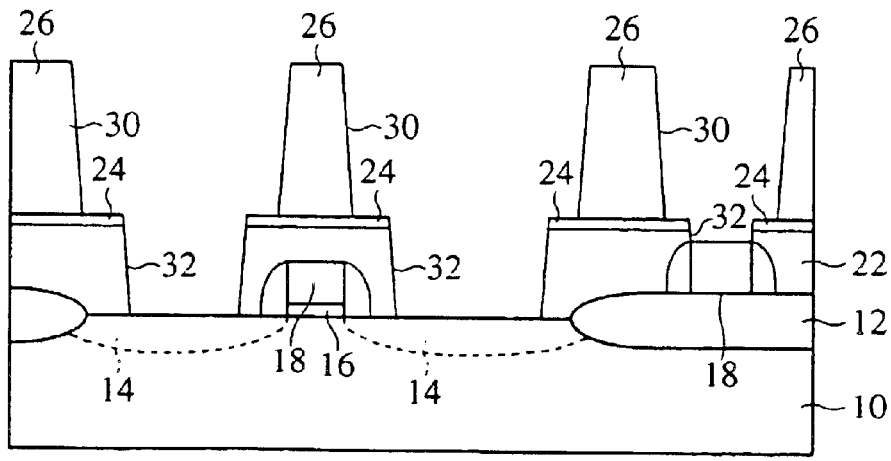

Next, the inter-layer insulation films 22, 26 are anisotropically etched with the resist film 28 and the stopper film 24 as a mask to form the interconnection grooves 30 in the inter-layer insulation film 26, and the via holes 32 in the inter-layer insulation film 22, which reach the source/drain diffused layer 14 and the gate electrode 18 (FIG. 4C).

Next, a 20–40 nm-thick TaN film is deposited on the entire surface by, e.g., reactive sputtering method. Thus, the barrier layer 34 of TaN film is formed. The barrier layer 34 is for preventing the Cu in the interconnection layers from diffusing into the inter-layer insulation films 22, 26. The TaN film may be also deposited by CVD method.

Then, an about 5–50 nm-thick Zr film is deposited in amorphous state on the entire surface by, e.g., sputtering method, CVD method or plating method. Thus, the adhesion layer 36 of the Zr film is formed.

Figure 5A:
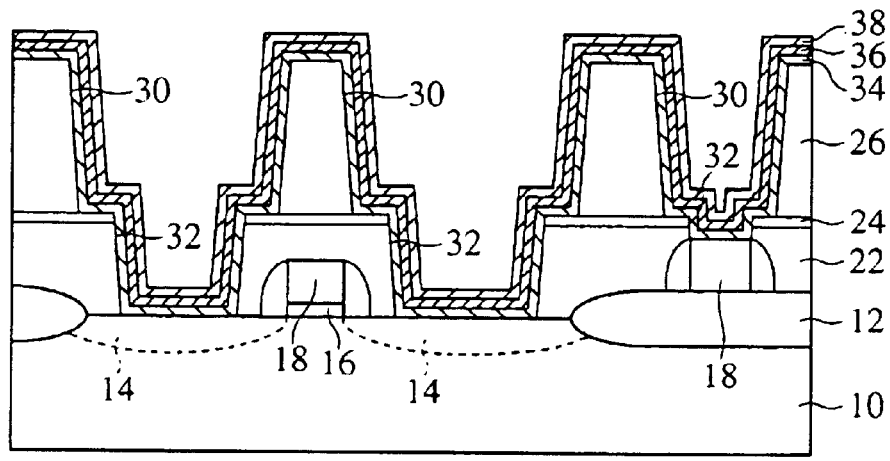

Next, an about 50–200 nm-thick Cu film is deposited on the entire surface by, e.g., sputtering method, CVD method or others. Thus, the Cu film 38 as the seed layer is formed (FIG. 5A). The Cu film 38 as the seed layer is deposited as the ground film for improving conductivity of the substrate when the Cu film is deposited by plating method.

The Cu film 38 as the seed layer is formed by a technique, such as sputtering method or others, which a film component is produced by high energy, so that part of the Cu forming the Cu film 38 as the seed layer intrudes into the adhesion layer 36 of Zr, which allows the adhesion between the adhesion layer 36 and the Cu film 38 as the seed layer to be improved even without a later heat treatment.

Figure 5B:
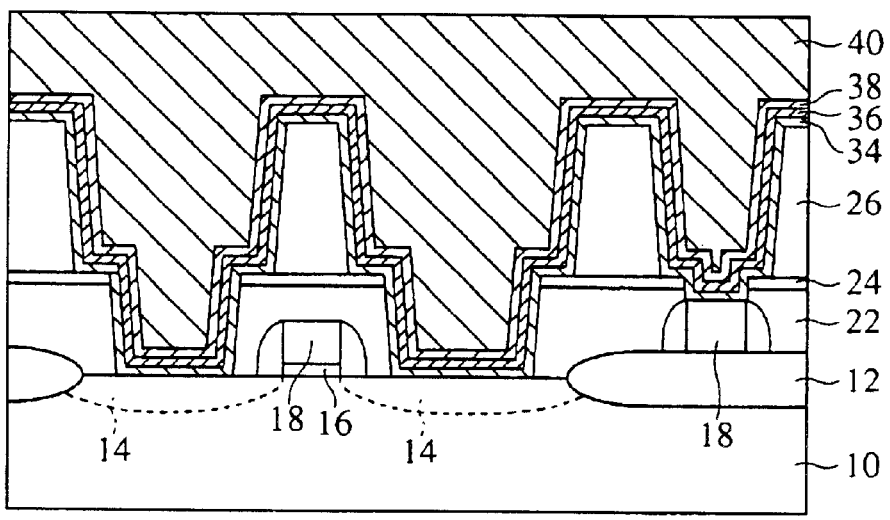

Next, an about 1000 nm-thick Cu film 40 is deposited on the entire surface by, e.g., plating method to completely fill the interconnection grooves 30 and the via holes 32 with the Cu film 40 (FIG. 5B).

Here, the Cu film 40 may be formed of pure copper or a copper alloy. Various Cu alloys, such as Cu—Sn (copper-tin) alloys, Cu—Mg (copper-magnesium) alloys, Cu—Al (copper-aluminum) alloys, etc., can be used. The use of Cu—Sn alloys can further improve the electro migration resistance. The use of Cu—Mg alloys can depress oxidation of the surface of the Cu film 40. In the present embodiment, the Cu film 40 is formed by plating method but may be formed by another technique, e.g., sputtering method or others, so as to fill the interconnection grooves 30 and the via holes 32 without forming the Cu film 38 as the seed layer.

Then, the Cu film 40, the Cu film 38 as the seed layer, the adhesion layer 36 and the barrier layer 34 are planarized by polishing by, e.g., CMP method until the inter-layer insulation film 26 is exposed, so that the Cu film 40, the Cu film 38 as the seed layer, the adhesion layer 36 and the barrier layer 34 are left only in the interconnection grooves 30 and the via holes 32.

Figure 5C:
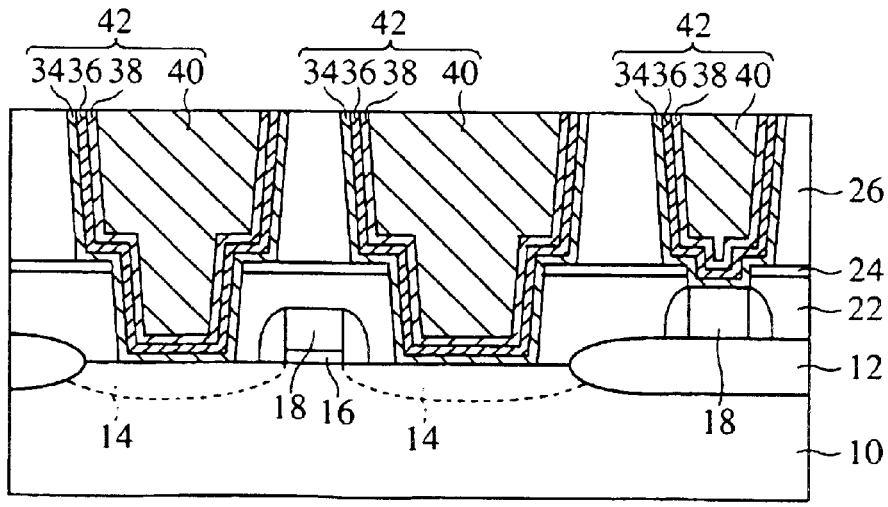

Thus, the interconnection layer 42 which is formed of the Cu film 40, the Cu film 38 as the seed layer, the adhesion layer 36 and the barrier layer 34, is interconnected to the source/drain diffused layer and the gate electrodes 18 through the via holes 32, and is buried in the interconnection grooves 30 is formed (FIG. 5C).

Figure 6A:
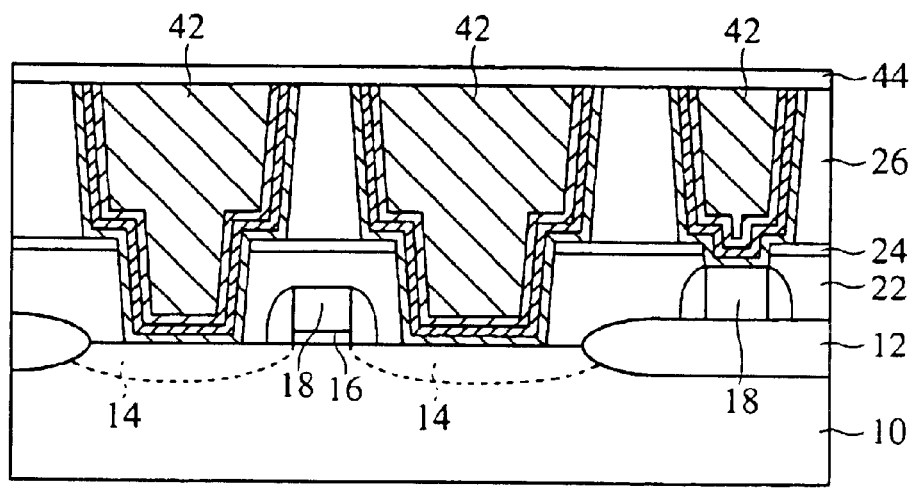

Next, the interconnection protecting film 44 of a 50–70 nm-thick silicon nitride film is formed on the interlayer insulation film 26 with the interconnection layer 42 buried in, by CVD method, for example (FIG. 6A).

Then, an about 500–700 nm-thick silicon oxide film is deposited on the interconnection protecting film 44 by, e.g., CVD method to form the inter-layer insulation film 46 of the silicon oxide film.

Then, a tens nm-thick silicon nitride film is deposited on the entire surface by, e.g., CVD method. Thus, the stopper film 48 of the silicon nitride film is formed.

Next, the stopper film 48 in the region where via holes for interconnecting an interconnection layer to be formed above and the interconnection layer 42 is removed by the usual lithography and etching.

Figure 6B:
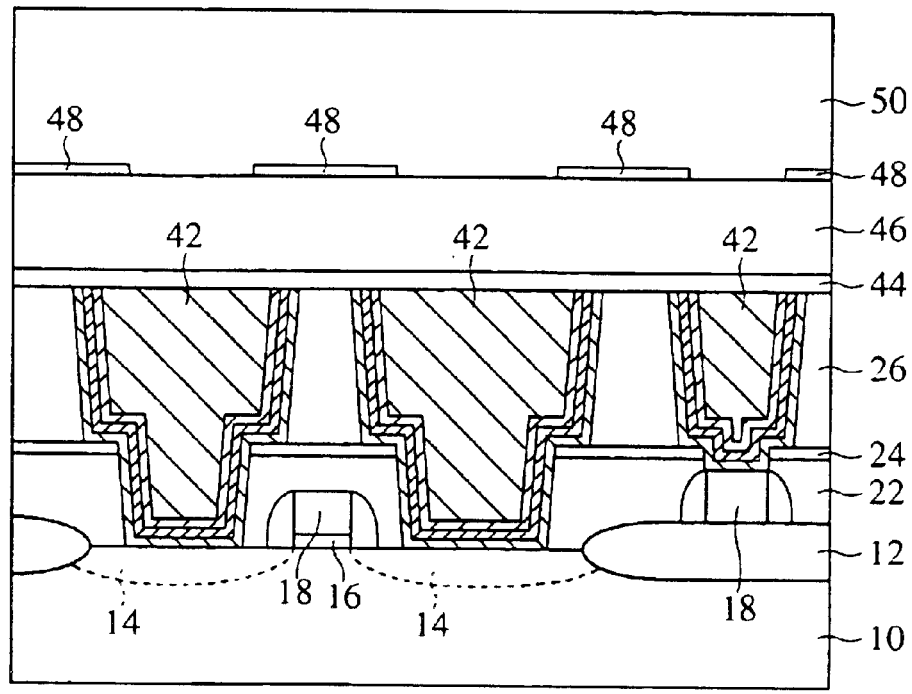

Then, an about 400 nm-thick silicon oxide film is deposited on the entire surface by, e.g., CVD method to form the inter-layer insulation film 50 of the silicon oxide film (FIG. 6B).

Figure 7A:
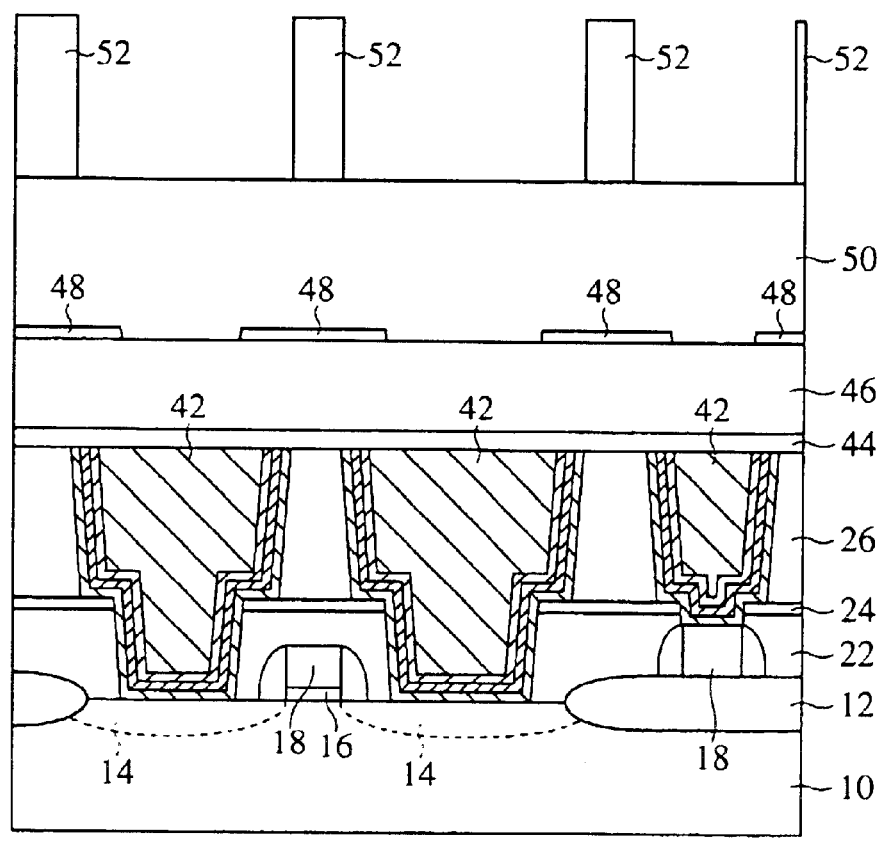

Next, the resist film 52 having the opening pattern corresponding to the interconnection layer to be formed is formed by the usual lithography (FIG. 7A).

Figure 7B:
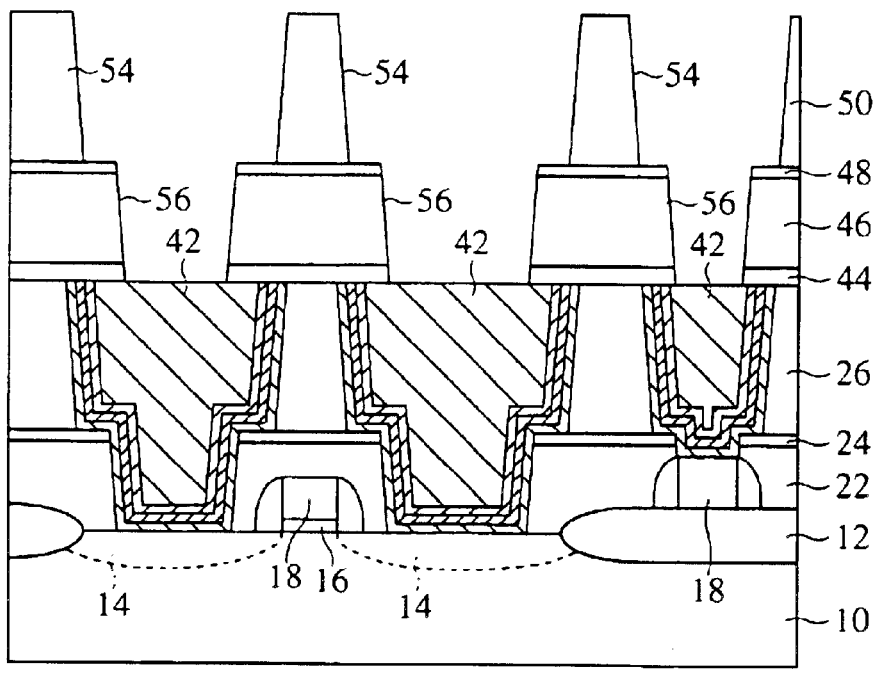

Next, with the resist film 52 and the stopper film 48 as a mask, the inter-layer insulation films 46, 50 and the interconnection protecting film 44 are anisotropically etched to form the interconnection grooves 54 in the interlayer insulation film 50, and the via holes 56 in the inter-layer insulation film 46 and the via holes 56 in the interconnection protecting film 44 and inter-layer insulation film 46 formed in the interconnection grooves 54 arriving at the interconnection layer 42 (FIG. 7B).

Then, a 25–30 nm-thick TaN film is deposited on the entire surface by, e.g., reactive sputtering method. Thus, the barrier layer 58 of the TaN film is formed.

Then, an about 5–50 nm-thick Zr film is deposited in amorphous state on the entire surface by, e.g., sputtering method. Thus, the adhesion layer 60 of the Zr film is formed.

Figure 8A:
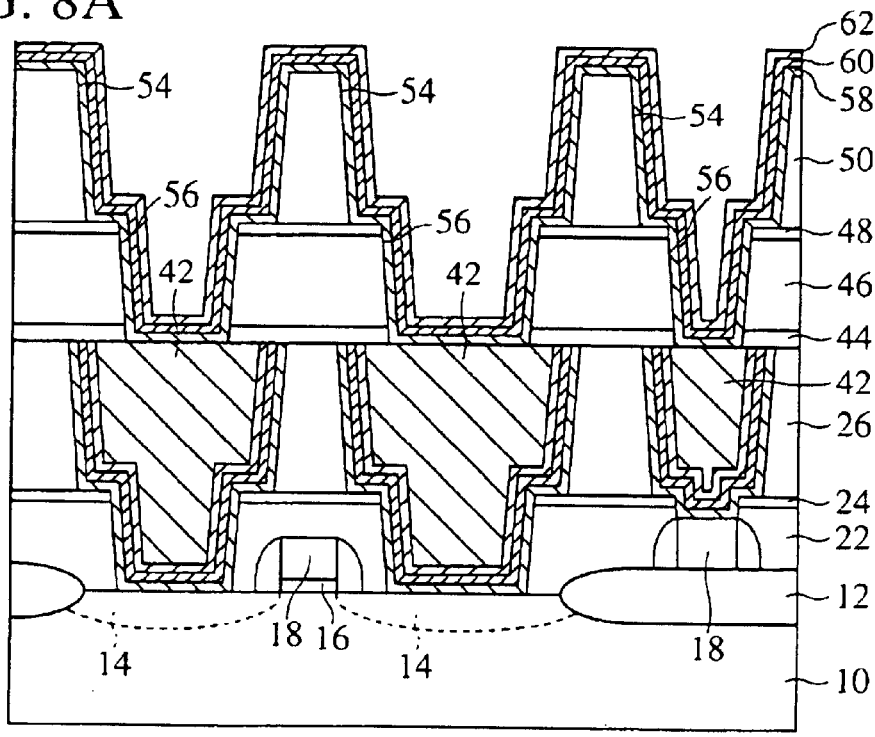

Next, an about 50–200 nm-thick Cu film is deposited on the entire surface by, e.g., sputtering method. Thus, the Cu film 62 as the seed layer of the Cu film is formed (FIG. 8A). As in forming the Cu film 38 as the seed layer, the Cu film 62 as the seed layer is formed by a film forming technique, such as sputtering method, which produces film components with high energy, so that part of the Cu forming the Cu film 62 as the seed layer introduces into the adhesion layer 60 of Zr. Accordingly, the adhesion between the adhesion layer 60 and the Cu film 62 as the seed layer can be improved even without a later thermal treating.

Figure 8B:
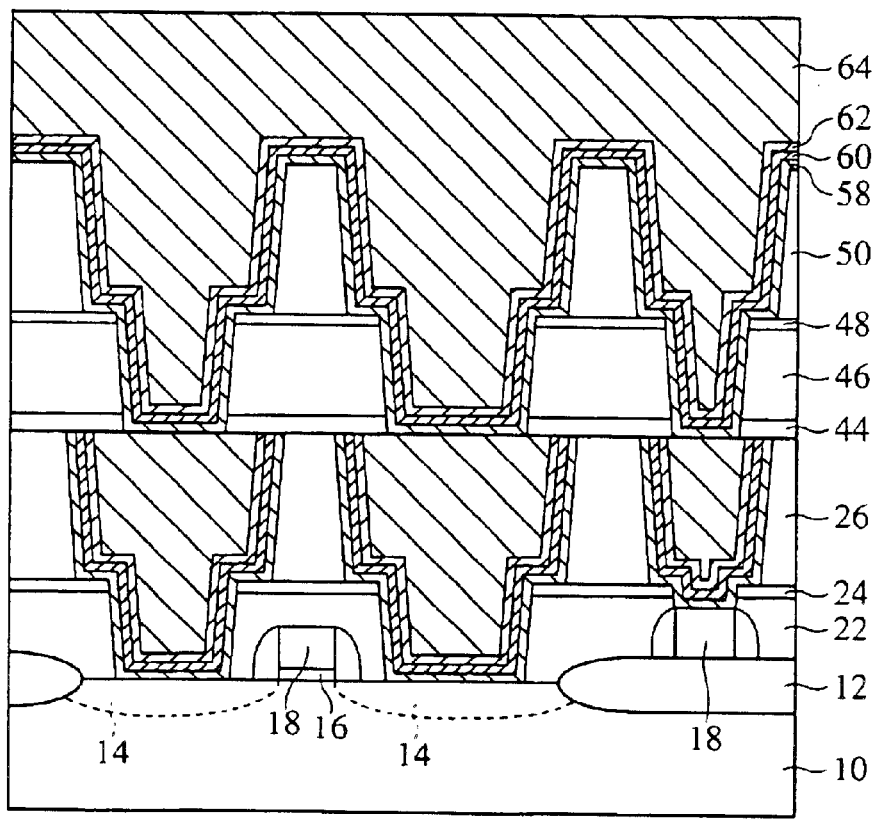

Then, an about 1000 nm-thick Cu film 64 is deposited on the entire surface by, e.g., plating method to completely bury the Cu film 64 in the interconnection grooves 54 and the via holes 56 (FIG. 8B).

Next, the Cu film 64, the Cu film 62 as the seed layer, the adhesion layer 60 and the barrier layer 58 are planarized by polishing by, e.g., CMP method until the inter-layer insulation film 50 is exposed, so as to leave the Cu film 64, the Cu film 62 as the seed layer, the adhesion layer 60 and the barrier layer 58 only in the interconnection grooves 54 and the via holes 56.

Figure 9A:
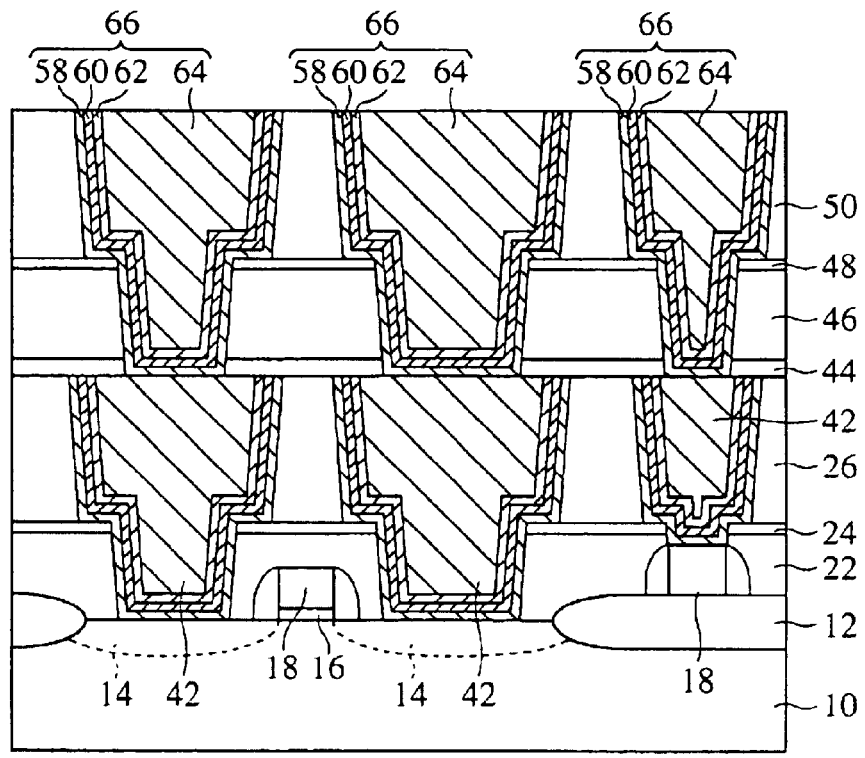
Figure 9B:
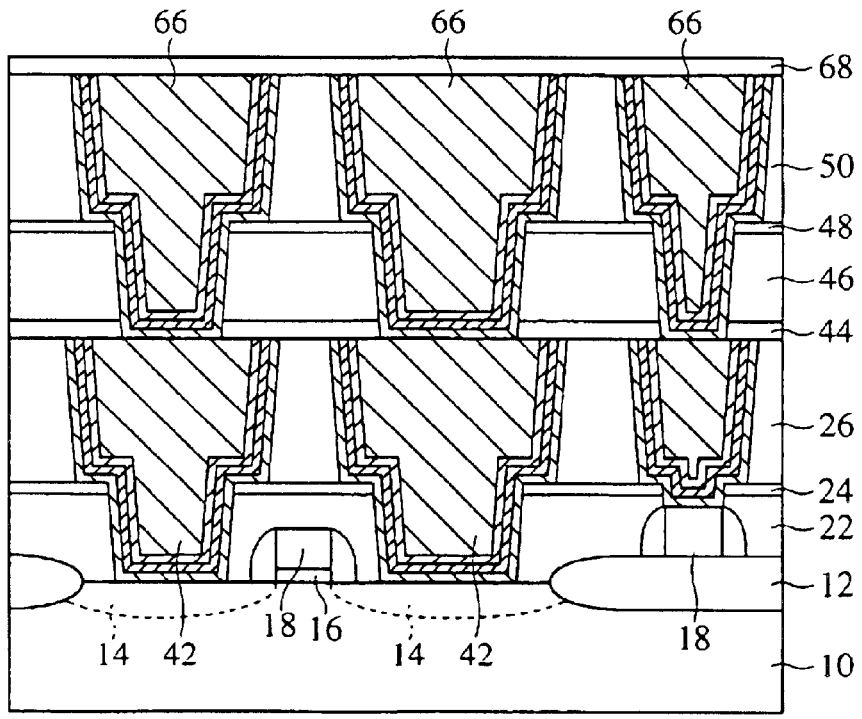

Thus, the interconnection layer 66 which is formed of the Cu film 64, the Cu film 62 as the seed layer, the adhesion layer 60 and the barrier layer 58, is connected to the interconnection layer 42 through the via holes 56 and is buried in the interconnection grooves 54 is formed (FIG. 9A).

Next, the interconnection protecting film 68 of an 50–70 nm-thick silicon nitride film is formed by, e.g., CVD method on the inter-layer insulation 50 with the interconnection layer 66 buried in.

Next, the third and the upper interconnection layers (not shown) are formed as required.

As described above, according to the present embodiment, the adhesion layer of Zr film is formed between the seed layer and the barrier layer, whereby the adhesion between the seed layer and the barrier layer can be improved. Accordingly, the peeling of the Cu film in the step of polishing the Cu film by CMP method can be prevented, and the semiconductor device can have higher yields and improved reliability.

[A Second Embodiment]

The method for fabricating the semiconductor device according to a second embodiment of the present invention will be explained with reference to FIGS. 2, 3A–3D, 4A–4C, 5A–5C, 6A–6B, 7A–7B, 8A–8B and 9A–9B. The same members of the present embodiment as those of the first embodiment are represented by the same reference numbers not to repeat or to simplify their explanation.

FIG. 2 is a diagrammatic sectional view of the semiconductor device according to the present embodiment, which show a structure thereof. FIGS. 3A–3D, 4A–4C, 5A–5C, 6A–6B, 7A–7B, 8A–8B and 9A–9B are sectional view of the semiconductor device according to the present embodiment in the steps of the method for fabricating the same, which explain the method.

The semiconductor device according to the present embodiment and the method for fabricating the semiconductor device are the same as those according to the first embodiment except the method for forming the barrier layer, the adhesion layer and the Cu film.

The method for fabricating the semiconductor device according to the present embodiment will be explained with reference to FIGS. 3A–3D, 4A–4C, 5A–5C, 6A–6B, 7A–7B, 8A–8B and 9A–9B.

First, in the same way as, e.g., in the method for fabricating the semiconductor device according to the first embodiment shown in FIGS. 3A to 4C, an inter-layer insulation film 26 with via holes 32 formed in, a stopper film 24, and an inter-layer insulation film 28 with interconnection grooves 30 formed in are formed on a silicon substrate 10 with a MOS transistor formed on.

Then, a 25–30 nm-thick TaN film is deposited on the entire surface by, e.g., reactive sputtering method. Thus, a barrier layer 34 of the TaN film is formed. The TaN film may be also formed by CVD method.

Next, an about 5–50 nm-thick Zr film is deposited in amorphous state on the entire surface by, e.g., sputtering method. Thus, an adhesion layer 36 of the Zr film is formed. The Zr film may be also formed by CVD method or plating method.

Next, an about 50–200 nm-thick Cu film is formed on the entire surface by, e.g., CVD method. Thus, Cu film 38 as a seed layer is formed (FIG. 5A).

Next, a low temperature heat treatment of about 200° C. or a rapid thermal treatment for some seconds and at 500° C. is made to diffuse part of the Zr forming the adhesion layer 36 in the Cu film 38. Thus the adhesion between the adhesion layer 36 and the Cu film 38 as the seed layer is improved. This heat treatment causes mutual diffusion between the adhesion layer 36 and a barrier layer 34, and the adhesion between the adhesion layer 36 and the barrier layer 34 is also improved.

In this heat treatment step, by the heat treatment at 300° C. for about 30 minutes, part of Zr forming the adhesion layer 36 may be diffused in the Cu film 38 as the seed layer to a solid solubility limit. In this way, the adhesion between the adhesion layer 36 and the Cu film 38 as the seed layer can be also improved. In this case, a film thickness of the adhesion layer 36, and a film thickness of the Cu film 38 as the seed layer are controlled so that the adhesion layer 36 is left between the adhesion layer 36 and the Cu film 38 as the seed layer even after the heat treatment.

Next, in the same way as, e.g., in the method for fabricating the semiconductor device according to the first embodiment, the interconnection layer 42 which is formed of the Cu film 40, the Cu film 38 as the seed layer, the adhesion layer 36 and the barrier layer 34, is interconnected to the source/drain diffused layer and the gate electrodes 18 through the via holes 32, and is buried in the interconnection grooves 30 is formed (FIGS. 5B–5C).

Then, in the same way as, e.g., in the method for fabricating the semiconductor device according to the first embodiment shown in FIGS. 6A to 9B, the second and the upper interconnection layers are formed.

As described above, according to the present embodiment, the adhesion layer of Zr film is formed between the seed layer and the barrier layer, and the heat treatment is made after the seed layer has been formed, whereby the adhesion between the seed layer and the barrier layer can be improved. Accordingly, the peeling of the Cu film in the step of polishing the Cu film by CMP method can be prevented, and the semiconductor device can have higher yields and higher reliability.

In the present embodiment, the method for fabricating the semiconductor device is applied to the step of forming the Cu interconnection layer 42 of the first layer, but may be applied to the step of forming the interconnection layer of the second or the upper interconnection layers.

[A Third Embodiment]

The semiconductor device and the method for fabricating the same according to a third embodiment of the present invention will be explained with reference to FIGS. 10, 11A–11C, 12A–12C, 13A–13B and 14A–14B. The same member of the present embodiment as those of the semiconductor device according to the first and the second embodiments and the method for fabricating the same are represented by the same reference numbers not to repeat or to simplify their explanation.

Figure 10:
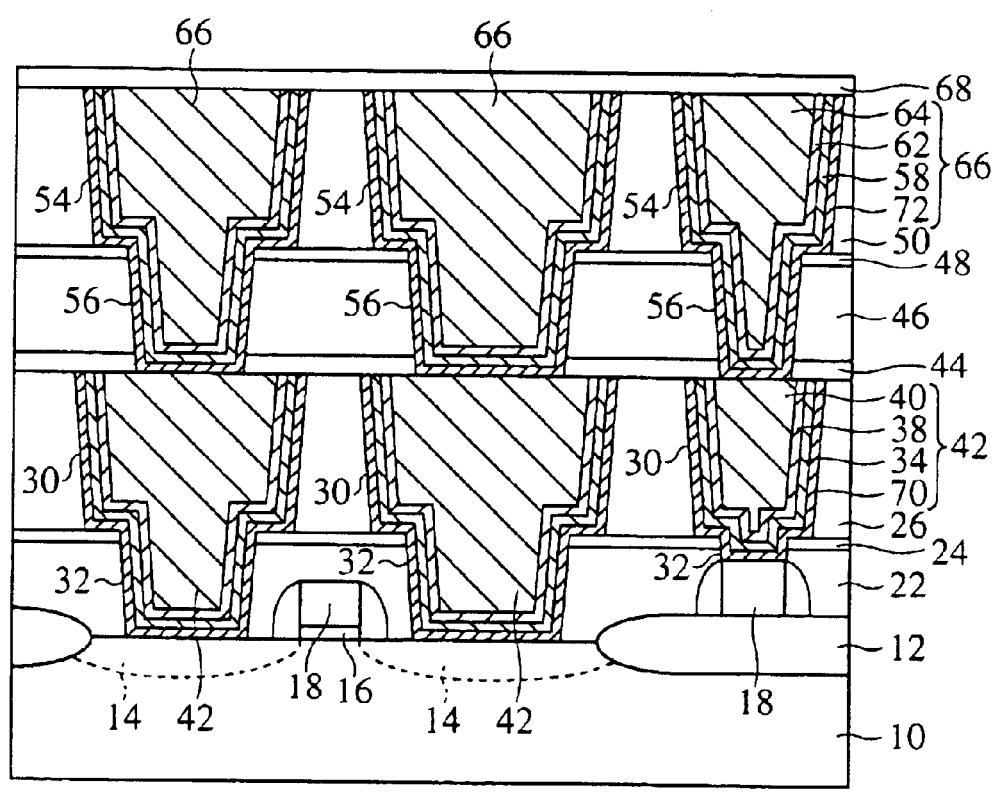
FIG. 10 is a diagrammatic sectional view of the semiconductor device according to a third embodiment of the present invention.

FIG. 10 is a diagrammatic sectional view of the semiconductor device according to the present embodiment, which shows a structure thereof. FIGS. 11A–11C, 12A–12C, 13A–13B and 14A–14B are sectional views of the semiconductor device in the steps of the method for fabricating the semiconductor device, which show the method.

The semiconductor device according to the present embodiment has the adhesion between the inter-layer insulation film and the barrier layer improved. The semiconductor device and the method for fabricating the same will be explained.

First, a structure of the semiconductor device according to the present embodiment will be explained with reference to FIG. 10.

A MOS transistor including a source/drain diffused layer 14 and a gate electrode 18 is formed in a device region of a silicon substrate 10 defined by a device isolation film 12.

On the silicon substrate 10 with the MOS transistor formed on, there are formed an inter-layer insulation film 22, a stopper film 24 and an inter-layer insulation film 26 the one on the other. Via holes 32 which reach the source/drain diffused layer 14 and the gate electrode 18 are formed in the inter-layer insulation film 22 and the stopper film 24. Interconnection grooves 30 are formed in the inter-layer insulation film 26 in the regions containing the regions where the via holes 32 are formed. In the via holes 32 and the interconnection grooves 30, an interconnection layers 42 formed of an adhesion layer 70 of Zr film, a barrier layer 34 of TaN film, a Cu film 38 as a seed layer and a Cu film 40 are buried.

On the inter-layer insulation film 26 with the interconnection layer 42 buried in, there are formed an interconnection protecting film 44, an inter-layer insulation film 46, a stopper film 48 and an inter-layer insulation film 50 the one on the other. Via holes 56 which reach the interconnection layer 42 are formed in the interconnection protecting film 44 and the inter-layer insulation film 46. Interconnection grooves 54 are formed in the inter-layer insulation film 50 in the regions containing the regions where the via holes 56 are formed. In the via holes 56 and the interconnection grooves 54, the interconnection layers 66 formed of an adhesion layer 72 of film, a barrier layer 58 of TaN film, a seed layer of Cu film 62 and a Cu film 64 are buried.

An interconnection protecting film 68 is formed on the inter-layer insulation film 50.

The semiconductor device according to the present embodiment has such structure.

The semiconductor according to the present embodiment is characterized in that the adhesion layer 70 of Zr film is formed between the inter-layer insulation films 22, 26 and the barrier layer 34, and the adhesion layer 72 of Zr film is formed between the inter-layer insulation films 46, 50 and the barrier layer 58. Because of the adhesion layers 70, 72 of Zr film thus arranged, the adhesion between the inter-layer insulation films 22, 26, 46, 50 and the adhesion layers 70, 72, and that between the adhesion layers 70, 72 and the barrier layers 34, 58 can be improved. Accordingly, in comparison with the conventional semiconductor device, the semiconductor device according to the present embodiment can have improved adhesion between the inter-layer insulation films and the barrier layers.

Next, the method for fabricating the semiconductor device according to the present embodiment will be explained with reference to FIGS. 11A–11C, 12A–12C, 13A–13B and 14A–14B.

Figure 11A:
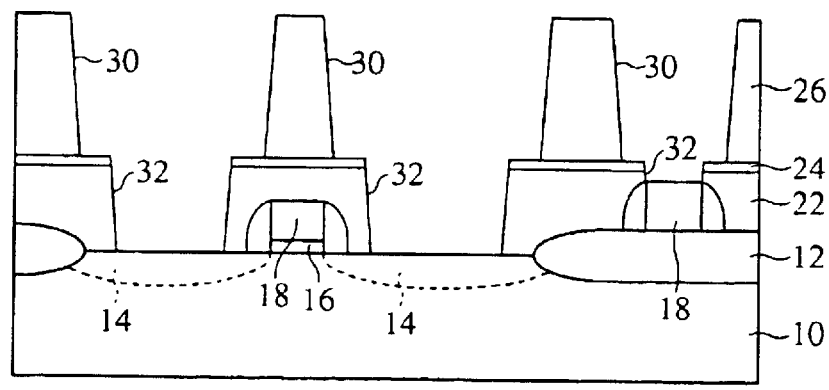
FIGS. 11A–11C, 12A–12C, 13A–13B and 14A–14B are sectional views of the semiconductor device according to the third embodiment of the present invention in the steps of the method for fabricating the same, which explain the method.

First, in the same way as, e.g., in the method for fabricating the semiconductor device according to the first embodiment shown in FIGS. 3A to 4C, the inter-layer insulation film 26 and the stopper film with the via holes 32 formed in, and the inter-layer insulation film 28 with the interconnection grooves 30 formed in are formed on a silicon substrate 10 with a MOS transistor fabricated on (FIG. 11A).

Figure 11B:
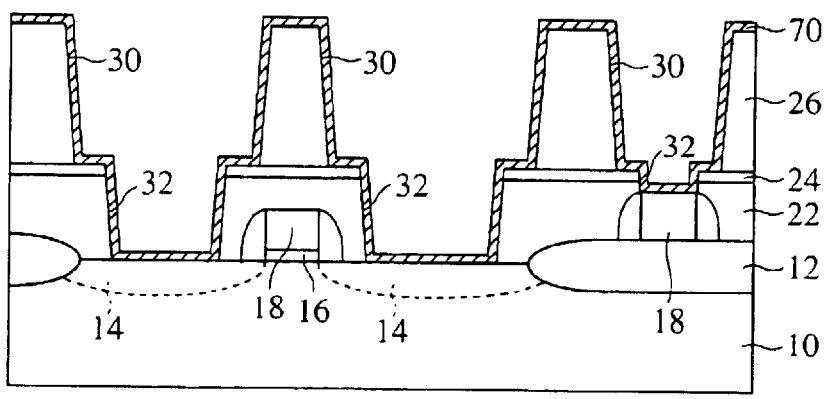

Next, an about 5–50 nm-thick Zr film is deposited on the entire surface by sputtering method. Thus, the adhesion layer 70 of the Zr film is formed (FIG. 11B).

Then, a 25–30 nm-thick TaN film is deposited on the entire surface by, e.g, reactive sputtering method. Thus, the barrier layer 34 of the TaN film is formed.

Figure 11C:
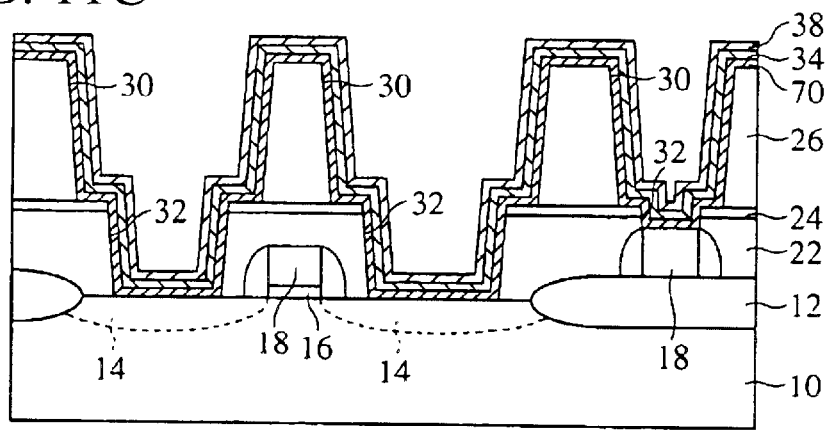

Next, an about 50–200 nm-thick Cu film is deposited on the entire surface by, e.g., sputtering method. Thus, the Cu film 38 as a seed layer is formed (FIG. 11C).

Figure 12A:
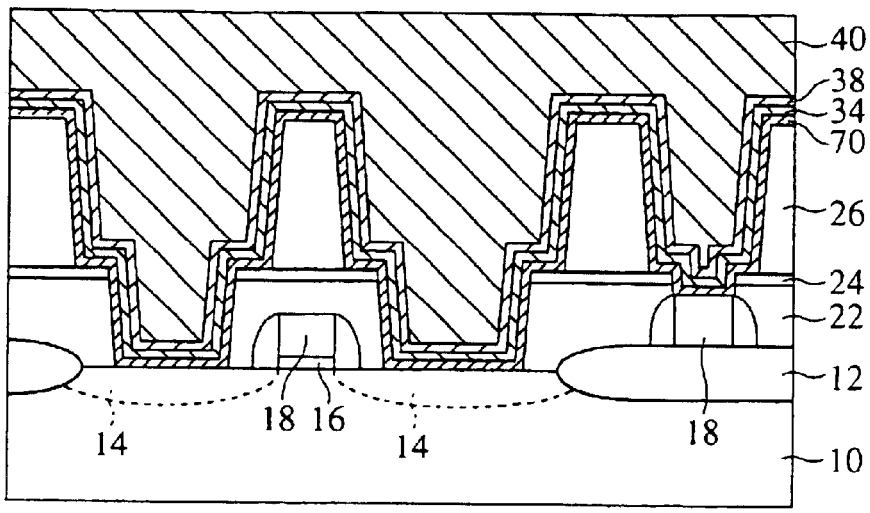

Then, an about 1000 nm-thick Cu film 40 is deposited on the entire surface by, e.g., plating method to completely fill the Cu film 40 in the interconnection grooves 30 and the via holes 32 (FIG. 12A).

Next, the Cu film 40, the Cu film 38 as the seed layer, the barrier layer 34 and the adhesion layer 70 are planarized by polishing by e.g., CMP method until the inter-layer insulation film 26 is exposed so as to leave the Cu film 40, the Cu film 38 as the seed layer, the barrier layer 34 and the adhesion layer 70 only in the interconnection grooves 30 and the via holes 32.

Figure 12B:
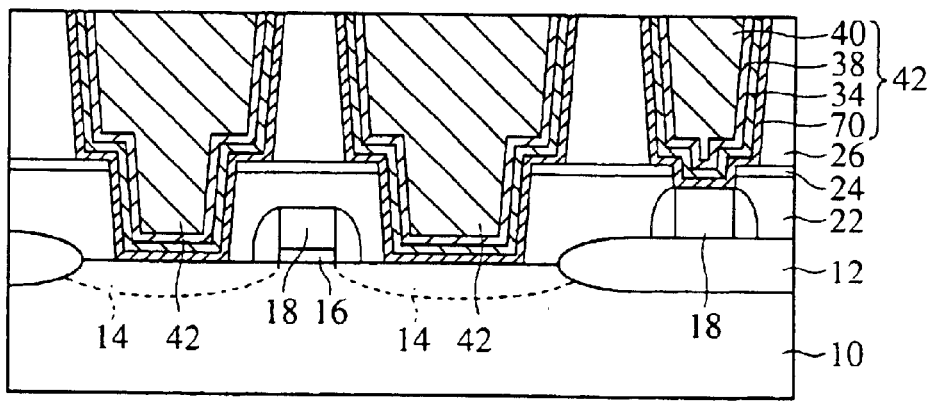

Thus, the interconnection layer 42 which is formed of the Cu film 40, the Cu film 38 as the seed layer, the barrier layer 34 and the adhesion layer 70, is connected to the source/drain diffused layer 14 and the gate electrode 18 through the via holes 32, and is buried in the interconnection grooves 30 is formed (FIG. 12B).

Figure 12C:
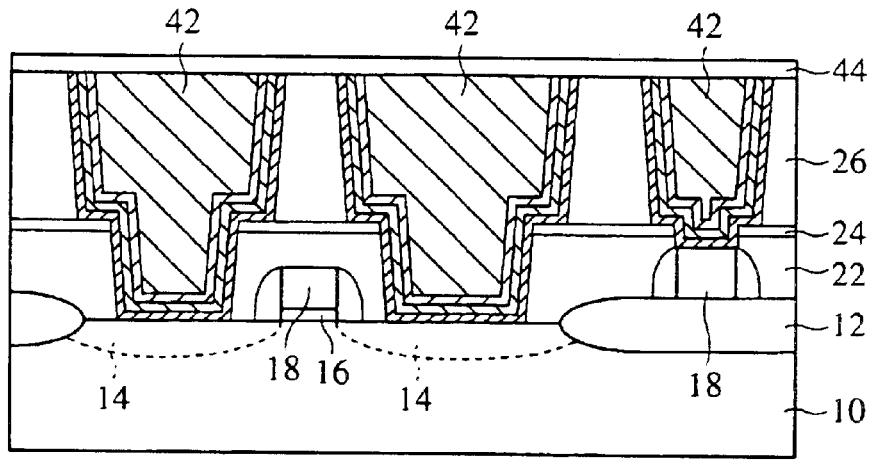

Then the interconnection protecting film 44 of a 50–70 nm-thick silicon nitride film is formed by, e.g., CVD method on the inter-layer insulation film 26 with the interconnection layer 42 buried in (FIG. 12C).

Figure 13A:
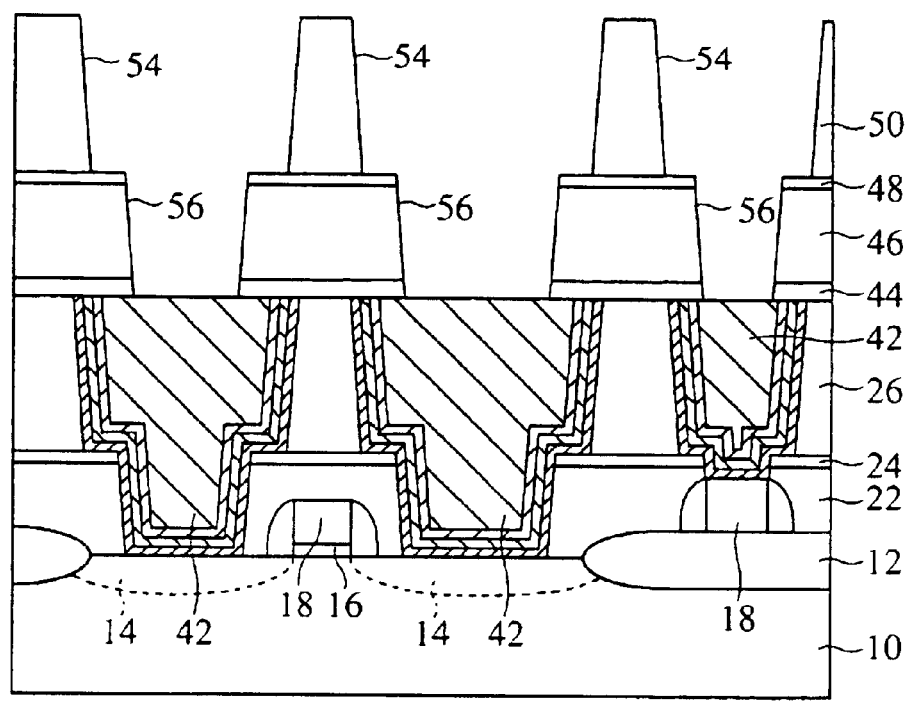

Then, in the same way as, e.g., in the method for fabricating the semiconductor device according to the first embodiment, the inter-layer insulation film 46 and the stopper film 48 with the via holes 56 formed in, and the inter-layer insulation film 50 with the interconnection grooves 54 formed in are formed (FIG. 13A).

Next, an about 5–50 nm-thick Zr film is deposited on the entire surface by, e.g., sputtering method. Thus, the adhesion layer 72 of the Zr film is formed.

Then, a 25–30 nm-thick TaN film is deposited on the entire surface by, e.g., reactive sputtering method. Thus, the barrier layer 58 of the TaN film is formed.

Then, an about 50–200 nm-thick Cu film is deposited on the entire surface by, e.g., sputtering method. Thus, the Cu film 62 as the seed layer is formed.

Figure 13B:
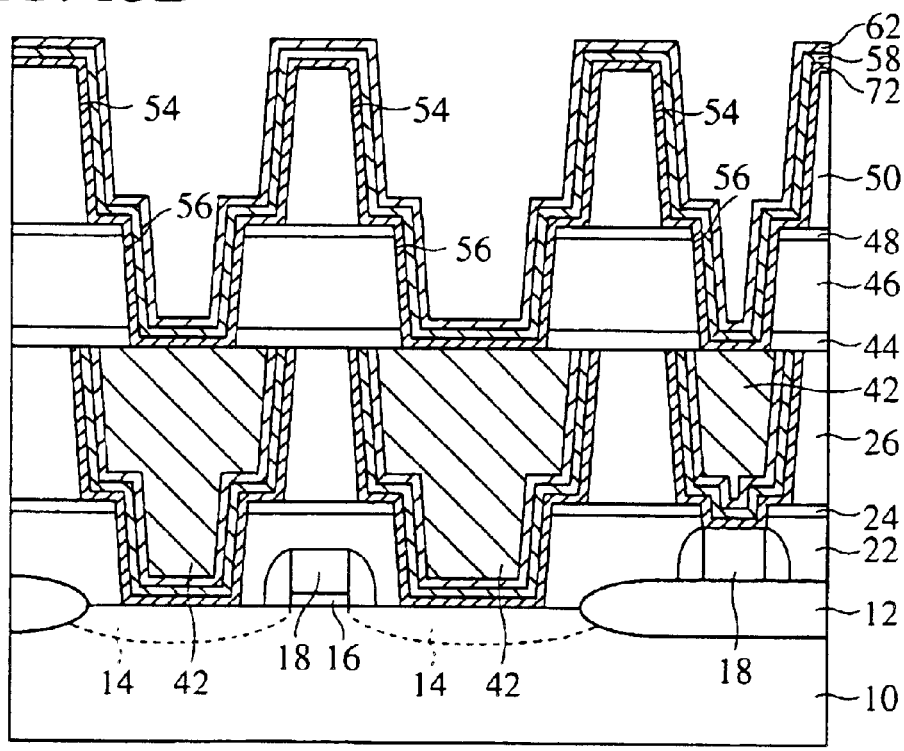

Next, an about 1000 nm-thick Cu film 40 is deposited on the entire surface by, e.g., plating to completely fill the interconnection grooves 30 and the via holes 32 with the Cu film 64 (FIG. 13B).

Then, the Cu film 64, the Cu film 62 as the seed layer, the barrier layer 58 and the adhesion layer 72 are polished by, e.g., CMP to be planarized, left only in the interconnection grooves 54 and the via holes 56.

Figure 14A:
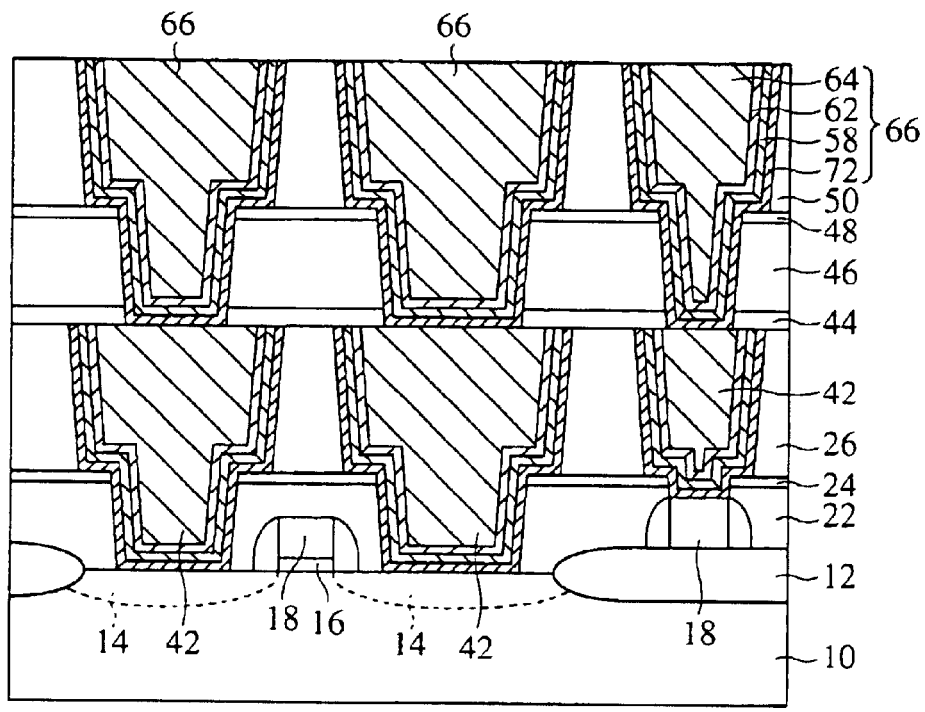

Thus, the interconnection layers 66 which is formed of the Cu film 64, the Cu film 62 as the seed layer, the barrier layer 58 and the adhesion layer 72, is connected to the interconnection layers 42 through the via holes 56, and is buried in the interconnection grooves 54 are formed (FIG. 14A).

Figure 14B:
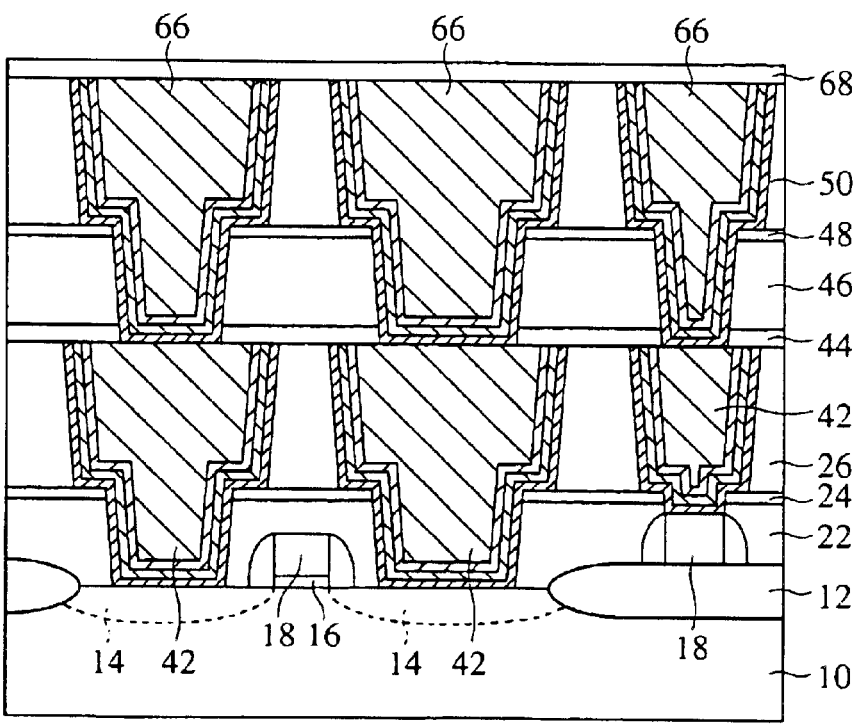

Then, the interconnection protecting film 68 of an 50–70 nm-thick silicon nitride film is formed, by e.g., CVD method on the inter-layer insulation film 50 with the interconnection layer 66 buried in (FIG. 14B).

Next, the third and the upper interconnection layers (not shown) are formed as required.

As described above, according to the present embodiment, the adhesion layer of Zr film is formed between the inter-layer insulation film and the barrier layer, whereby the adhesion between the inter-layer insulation film and the barrier layer can be improved. Accordingly, the peeling of the Cu film in the step of polishing the Cu film by CMP method can be prevented, and the semiconductor device can have higher yields and higher reliability.

[A Fourth Embodiment]

The semiconductor device and the method for fabricating the same according to a fourth embodiment of the present invention will be explained with reference to FIGS. 15, 16A–16D, 17A–17B and 18A–18B. The same members of the present embodiment as those of the structures of the semiconductor device according to first to the third embodiments shown in FIGS. 2 to 14 are represented by the same reference numbers not to repeat or to simplify their explanation.

Figure 15:
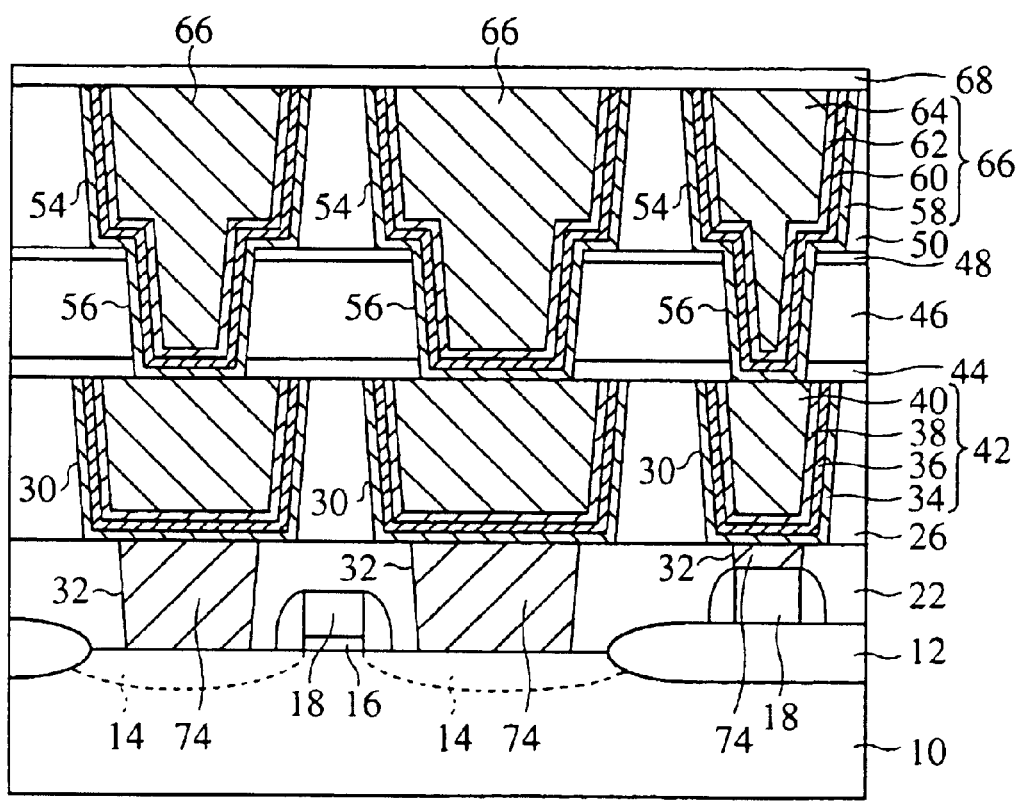
FIG. 15 is a diagrammatic sectional view of the semiconductor device according to a fourth embodiment of the present invention.

FIG. 15 is a diagrammatic view of the semiconductor device according to the present embodiment, which shows a structure thereof. FIGS. 16A–16D, 17A–17B and 18A–18B are sectional views of the semiconductor device in the steps of the method for fabricating the same, which explain the method.

In the first to the third embodiments described above, the method for forming the interconnection layer by the so-called dual damascene process in which the via holes and the interconnection grooves are opened in one and the same step, and the interconnection layer is buried in the grooves and holes. However, the present invention is applicable to the so-called single damascene process in which the inter-layer insulation film with the copper interconnection layer buried is formed after the interlayer insulation film with the electrode plugs buried in the via holes is formed. The semiconductor device according to the present embodiment has a single damascened structure, and the semiconductor device and the method for fabricating the semiconductor device will be explained.

First, a structure of the semiconductor device according to the present embodiment will be explained with reference to FIG. 15.

As shown in FIG. 15, the semiconductor device according to the present embodiment is the same as the semiconductor device according to the first embodiment in that the interconnection layer 42 is formed of the barrier layer 34, the adhesion layer 36, the Cu film 38 as the seed layer and the Cu film 40, and an interconnection layer 66 is formed of the barrier layer 58, the adhesion layer 60, the Cu film 62 as the seed layer and the Cu film 64. The semiconductor device according to the present embodiment is characterized in that the interconnection layer 42 is connected to a ground structure through electrode plugs 74 buried in via holes 32.

Next, the method for fabricating the semiconductor device according to the present embodiment will be explained.

Figure 16A:
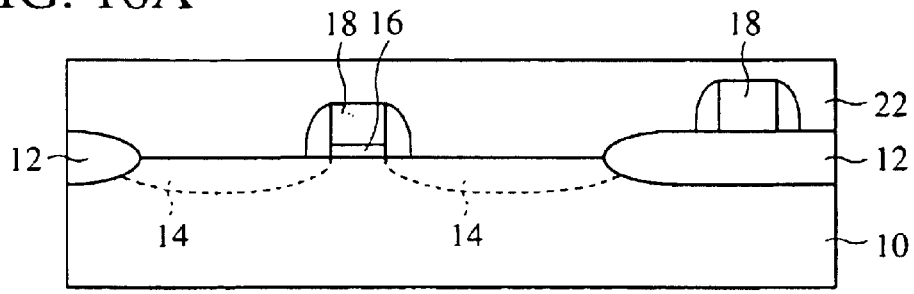
FIGS. 16A–16D, 17A–17B and 18A–18B are sectional views of the semiconductor device according to the fourth embodiment of the present invention in the steps of the method for fabricating the same, which explain the method.

First, in the same way as, e.g., in the method for fabricating the semiconductor device according to the first embodiment, a MOS transistor, and an inter-layer insulation film 22 covering the MOS transistor are formed (FIG. 16A).

Figure 16B:
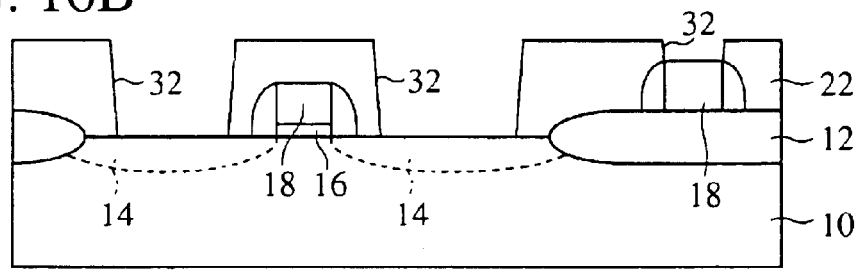
Figure 16C:
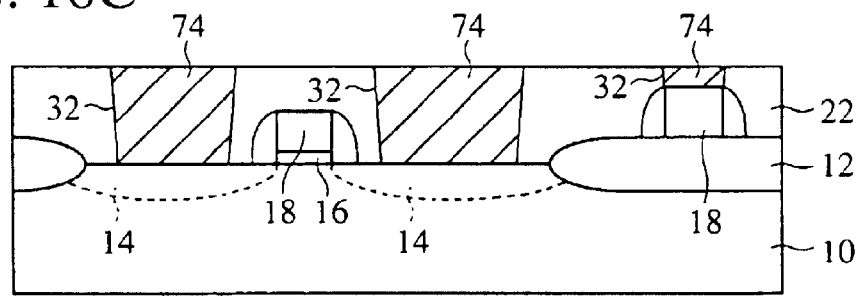

Then, via holes 32 reaching the source/drain diffused layer 14 and the gate electrode 18 are formed in the interlayer insulation film 22 by the usual lithography and etching (FIG. 16B). Next, TiN film of, e.g., a 80 nm-thick and W (tungsten) film of, e.g., a 350 nm-thick are deposited by CVD method, and then are planarized by being polished by CMP method until the surface of the inter-layer insulation film 22 is exposed. Thus, the electrode plugs 74 buried in the via holes 32 and electrically connected to the source/drain diffused layer 14 or the gate electrode 18 are formed (FIG. 16C).

Next, an about 400 nm-thick silicon oxide film is deposited on the entire surface by, e.g., CVD method to form the inter-layer insulation film 26 of the silicon oxide film.

Figure 16D:
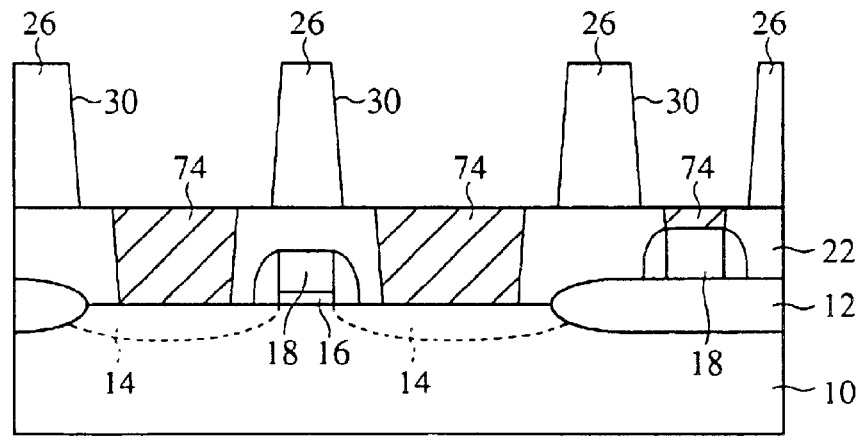

Then, the interconnection grooves 30 are formed in the inter-layer insulation film 26 by the usual lithography and etching (FIG. 16D).

Figure 17A:
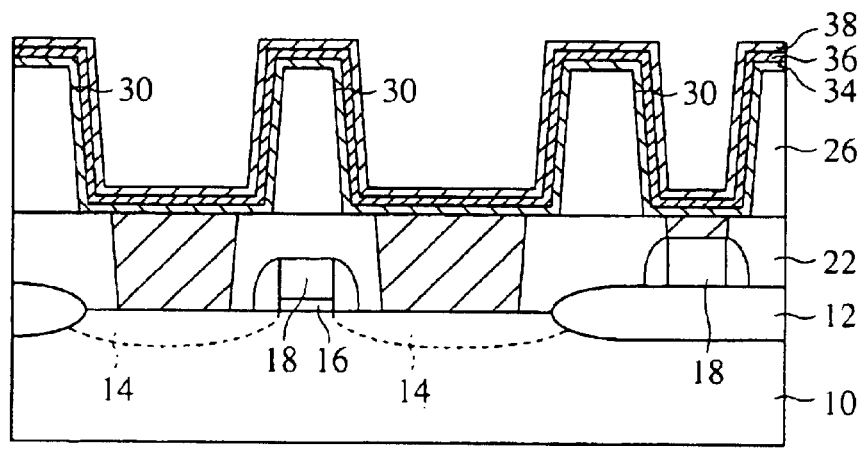

Next, in the same way as, e.g., in the method for fabrication the semiconductor device according to the first embodiment shown in FIG. 4A, the barrier layer 34 of TaN film of, e.g., 25–30 nm-thick, the adhesion layer 36 of amorphous Zr film of, e.g., a 5–50 nm-thick and the Cu film 38 as the seed layer of, e.g., 50–200 nm-thick are formed (FIG. 17A).

Figure 17B:
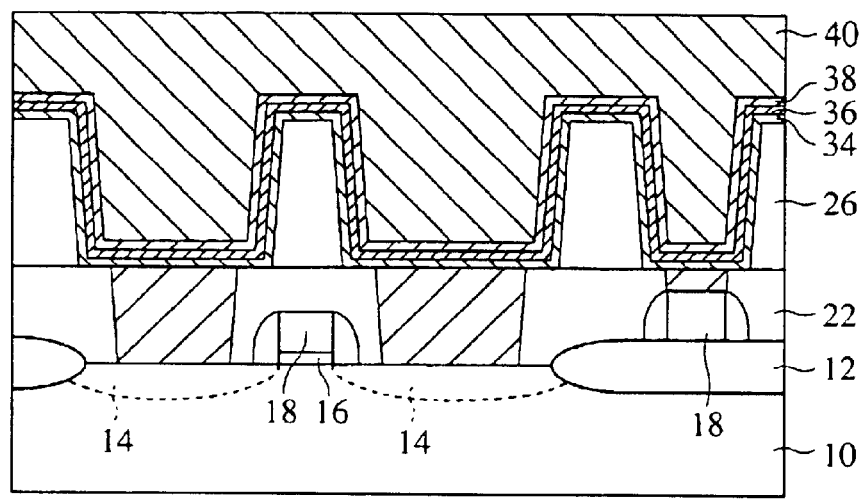

Next, the Cu film of an about 1000 nm-thick is deposited on the entire surface by, e.g., plating method to completely fill the interconnection groove 30 with the Cu film 40 (FIG. 17B).

Figure 18A:
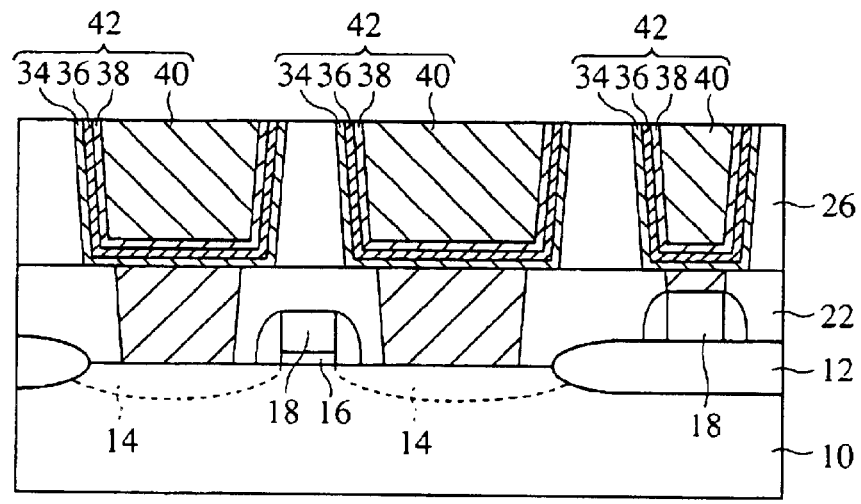

Next, the Cu film 40, the Cu film 38 as the seed layer, the adhesion layer 36 and the barrier layer 34 are polished, planarized by, e.g., CMP method until the interlayer insulation film 26 is exposed, left only in the interconnection grooves 30. Thus, the interconnection layer 42 which is formed of the Cu film 40, the Cu film 38 as the seed layer, the adhesion layer 36 and the barrier layer 34, is connected to the source/drain diffused layer or the gate electrode 18 through the electrode plugs 74, and is buried in the interconnection grooves 30 is formed (FIG. 18A).

Figure 18B:
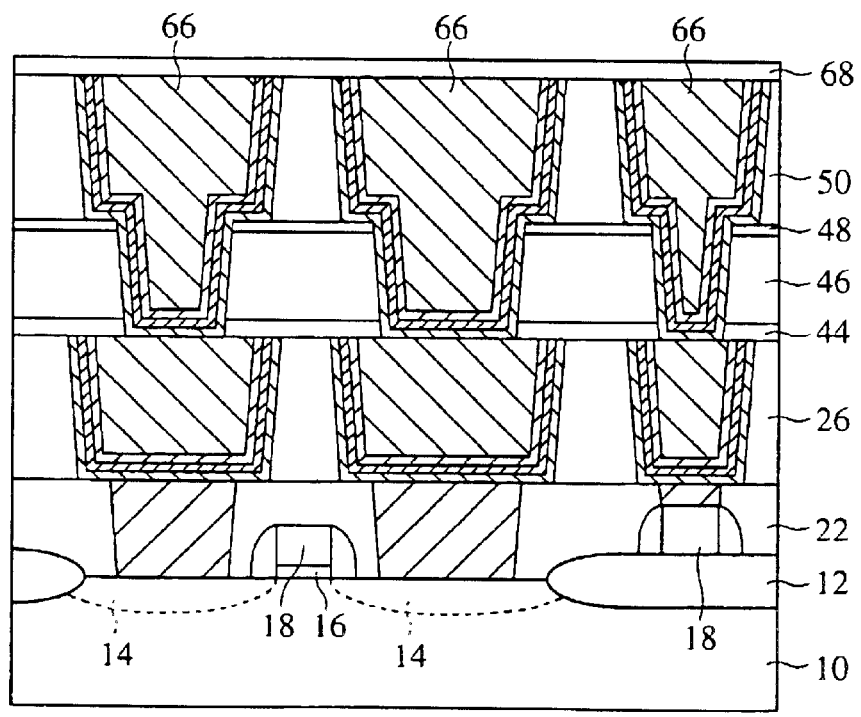

Next, in the same way as, e.g., in the method for fabricating the semiconductor device according to the first embodiment shown in FIGS. 6A to 9B, the interconnection layer 66 formed of the Cu film 64, the Cu film 62 as the seed layer, the adhesion layer 60 and the barrier layer 58, is connected to the interconnection layer 42 through the via holes 56, and is buried in the interconnection grooves 54, the interconnection protecting film 66, etc. are formed (FIG. 18B).

As described above, according to the present embodiment, the semiconductor device having the single damascene structure includes the adhesion layer of Zr film formed between the seed layer and the barrier layer, whereby the adhesion between the seed layer and the barrier layer can be improved. Accordingly, the peeling of the Cu film in the step of polishing the Cu film by CMP method can be prevented, and the semiconductor device can have higher yields and higher reliability.

In the present embodiment, the single damascene structure is applied to the first interconnection layer, but the single damascene structure is applicable to the second and the upper interconnection layers. The single damascene structure can be applicable only to the second and the upper interconnection layers.

In the present embodiment, the single damascene structure is applied to the semiconductor device according to the first embodiment and the method for fabricating the same, but is applicable to the semiconductor device and the method for fabricating the same according to the second and the third embodiments.

[A Fifth Embodiment]

The semiconductor device and the method for fabricating the same according to a fifth embodiment of the present invention will be explained with reference to FIGS. 19 and 20A–20D. The same members of the present embodiment as those of the semiconductor device and the method for fabricating the same according to the first to the fourth embodiments are represented by the same reference numbers not to repeat or to simplify their explanation.

Figure 19:
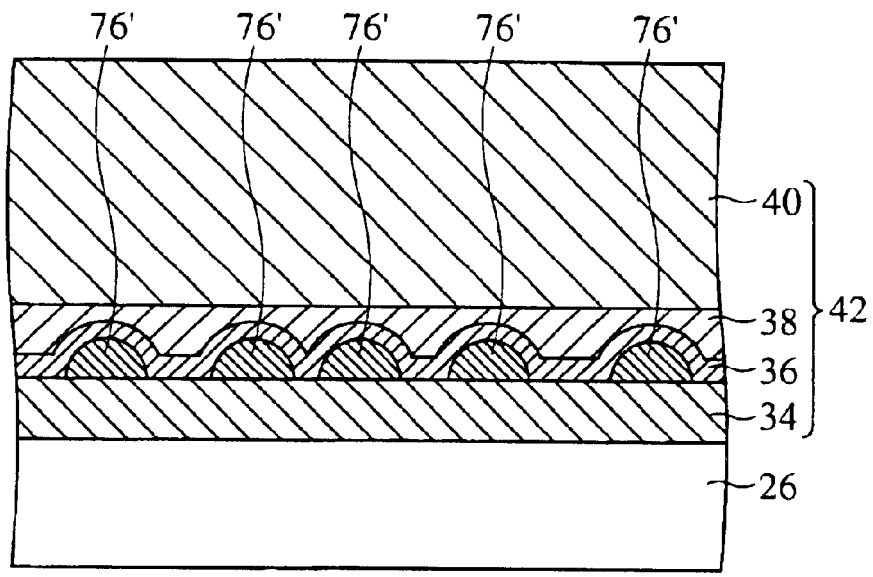
FIG. 19 is a diagrammatic sectional view of the semiconductor device according to a fifth embodiment of the present invention.

FIG. 19 is a diagrammatic view of the semiconductor device according to the present embodiment, which shows the structure thereof. FIGS. 20A–20D are sectional views of the semiconductor device in the steps of the method for fabricating the semiconductor device, which explain the method. FIGS. 19 and 20A–20D are enlarged sectional views of a region corresponding to the region of the semiconductor device according to the first embodiment where the interconnection layer 42 is formed.

First, a structure of the semiconductor device according to the present embodiment will be explained with reference to FIG. 19.

The semiconductor device according to the present embodiment is characterized in that, as shown in FIG. 19, island-shaped structures of Cu—Zr (copper-zirconium) alloy film (which is also called as islands of Cu—Zr alloy in this specification) 76' are formed between a barrier layer 34 and an adhesion layer 36, and the barrier layer 34, the Cu—Zr alloy film 76', the adhesion layer 36 and the Cu films 38, 40 form the interconnection layer 42, and also in that in the same way, island-shaped structures of Cu—Zr alloy film 78' are formed similarly between a barrier layer 58 and an adhesion layer 60, and the barrier layer 58, the Cu—Zr alloy film 78', the adhesion layer 60 and the Cu films 62, 64 form an interconnection layer 66. The semiconductor device according to the present embodiment is the same as the semiconductor device according to the first embodiment shown in FIG. 2 in the rest.

Next, with reference to FIG. 19, the constitutions of the interconnection layers 42, 66 will be detailed.

As shown in FIG. 19, the island-shaped structures of the Cu—Zr alloy film 76' are formed spaced from each other along the interface between the adhesion layer 36 of Zr film and the barrier layer 34. On the adhesion layer 36, the Cu film 38 as the seed layer and the Cu film 40 to fill the interconnection grooves 30 and the via holes 32 are formed.

The Cu—Zr alloy film 76' is formed of a very thin film having a below about 20 nm-thick and is not formed as a perfect layer film. Accordingly, as shown in FIG. 19, the island-shaped (particle-shaped) structures are spaced from each other. The Cu—Zr alloy film 76' is formed in such island-shaped structures and spaced from each other on the barrier layer 34, whereby the adhesion layer 36 adheres to the Cu—Zr alloy film 76' therebelow in the region where the Cu—Zr ally film 76' is formed and the barrier layer 34 therebelow in the region where the Cu—Zr alloy film 76' is not formed. Accordingly, the barrier layer 34 and the adhesion layer 36 are meshed mechanically with each other by the island-shaped structures of the Cu—Zr alloy film 76'.

The Zr of the adhesion layer 36 is diffused in the island-shaped Cu—Zr alloy film 76' during the fabrication process which will be described later. Accordingly, the composition continuously changes in the interface between the island-shaped Cu—Zr alloy film 76' and the adhesion layer 36, forming no exact interface. The adhesion between the adhesion layer 36 and the Cu—Zr alloy film 76' can be accordingly improved. Also in the interface between the adhesion layer 36 and the barrier layer 34 the constituent elements are mutually diffused, whereby high adhesion is ensured in the interface between the Cu—Zr alloy film 76' and the barrier layer 34. Furthermore, the Cu—Zr alloy film 76' is formed in micro rugged surface and mechanically meshes the interface between the adhesion layer 36 and the barrier layer 34, whereby the adhesion layer 36 and the barrier layer 34 can be sturdily adhered to each other.

As described above, the Cu film 38 and the barrier layer 34 are sturdily adhered to each other by the adhesion layer 36 and the Cu—Zr alloy film 76', whereby even when a process which applies a mechanical stress to the Cu films 1:39, 40 by CMP method or others is used, the peeling of the Cu films 38, 40 from the barrier layer 34 can be prevented, and the stress migration resistance can be improved. The improved adhesion between the Cu film 38 and the barrier layer 34 can minimize the atom migration near the interface between the Cu film 38 and the barrier layer 34 when large current is applied to the interconnection layer 42. The effect improving the electro migration resistance can be provided.

Then, the method for fabricating the semiconductor device according to the present embodiment will be explained with reference to FIGS. 20A–20D.

First, in the same way as, e.g., in the method for fabricating the semiconductor device according to the first embodiment shown in FIGS. 3A to 4C, the inter-layer insulation film 22 with the via holes 32 formed in, and the inter-layer insulation film 26 with the interconnection grooves 30 formed in are formed on a silicon substrate 10.

Next, in the same way as, e.g., in the method for fabricating the semiconductor device according to the first embodiment shown in FIG. 5A, the barrier layer 34 of, e.g., a 20–40 nm-thick TaN film is formed.

Figure 20A:
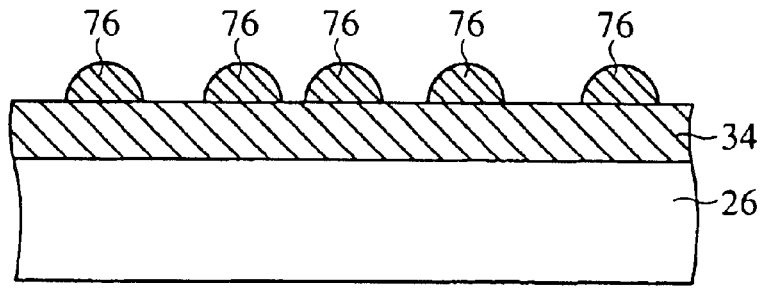
FIGS. 20A–20D are sectional views of the semiconductor device according to the fifth embodiment of the present invention in the steps of the method for fabricating the same, which explain the method.

Next, the island-shaped Cu film (which is also called as islands of Cu or islands of Cu as a main component in this specification) 76 is formed on the entire surface of the silicon substrate 10, covering the barrier layer 34 (FIG. 20A). To be specific, the Cu film 76 is formed in an about 30 nm-thick by sputtering method with a vapor deposition amount controlled and with the silicon substrate 10 heated to 100° C.–250° C. Thus, the Cu film 76 is not formed uniform but formed in a number of circular island-shaped structures of an about 20 nm-diameter as viewed in plane.

Here, when the Cu film 76 is formed in a 30 nm or more film thickness, adjacent island-shaped structures become continuous in a; uniform film, and the island-shaped structures cannot be formed. The Cu film 76 must be formed in a below 30 nm-thick. The Cu film 76 formed in a below 30 nm-thick has a 2–20 nm-space between the island-shaped structures. A substrate temperature at the time when the Cu film 76 is formed is changed to change a film thickness and a diameter of the island-shaped structures of the Cu film 76. When a substrate temperature is low, a film thickness and a diameter are small. The silicon substrate 10 is heated from below by a heater, but may be heated from above with a light source, such as a lamp or others. The Cu film 76 can be formed by CVD method or plating method.

Figure 20B:
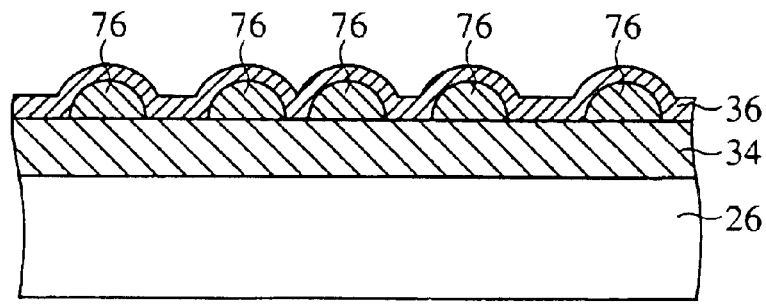

Then, an about 5–50 nm-thick Zr film is deposited on the entire surface of the silicon substrate 10. The Zr film is formed by puttering method, CVD method, plating method or others. Thus, the adhesion layer 36 of the Zr film is formed (FIG. 20B).

Figure 20C:
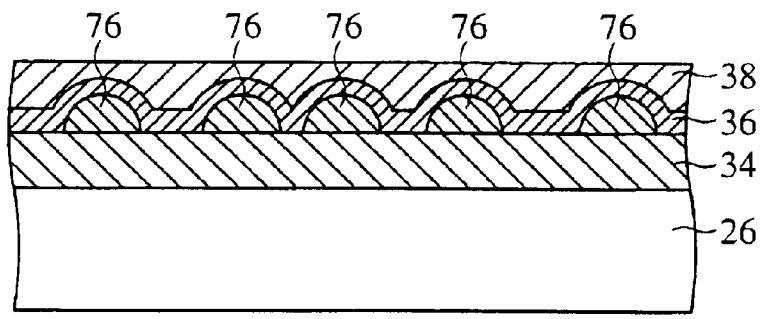

Next, the Cu film 38 as the seed layer is formed in an about 50–200 nm-thick by sputtering method, CVD method or others (FIG. 20C). The Cu film 38 as the seed layer is deposited as a ground film for enhancing conductivity of the substrate when the Cu film is deposited by plating method.

Figure 20D:
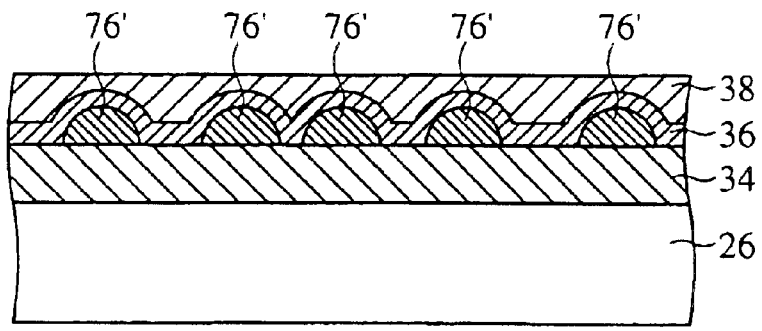

Then, after the Cu film 38 as the seed player has been formed, a heat treatment is made. The heat treatment is made at a low temperature of, e.g., 200° C. or at a temperature of, e.g., 500° C. for some seconds by the rapid thermal treatment. Thus, the Zr in the adhesion layer 36 is diffused into the Cu film 76 of the island-shaped structures of fine crystal structure, and the Cu film 38 as the seed layer, and the Cu film 76 becomes the Cu—Zr alloy film 76' (FIG. 20D).

Because the Cu film 76 of a fine crystal structure has a small volume, the Zr is diffused by the heat treatment of the low temperature or the rapid thermal treatment, whereby the adhesion between the Cu—Zr alloy film 76' and the barrier 34 is improved. The Zr is diffused also in the barrier layer 34, so that the barrier layer 34 near the interface between the adhesion layer 36 and the barrier layer 34 or the barrier layer 34 near the interface between the Cu—Zr alloy film 76' and the barrier layer 34 and the adhesion is enhanced. Further, the island-shaped Cu—Zr alloy film 76' having rugged surface are formed between the barrier layer 34 and the adhesion layer 36 and mesh the barrier layer 34 and the adhesion layer 36 with each other at the interface therebetween. This structure is reinforced against mechanical stress. It is possible to form only the adhesion layer 36 of Zr to thereby improve the adhesion between the adhesion layer 36 and the Cu film 76 or the barrier layer 34. However, the above-described heat treatment ensure the diffusion of the Zr into the Cu film 76 of the island-shaped structures and in the barrier layer 34, whereby the adhesion can be further improved. A heat treatment temperature and a heat treatment period of time are not limited to the above-described temperature and period of time as long as the purpose of diffusing the Zr into the island-shaped Cu film 76 and the Cu film 38 is achieved.

Then, in the same way as, e.g., in the method for fabricating the semiconductor device shown in FIGS. 5B to 9B and the method for forming the interconnection layer 42 shown in FIGS. 20A–20D, the interconnection layer 66, etc. are formed.

As described above, according to the present embodiment, the structure of the interconnection layer 42 formed by forming the barrier layer 34 and the adhesion layer 36, covering the inside walls of the interconnection grooves 30 and the via holes 32 and filling the Cu films 38, 40 in the interconnection grooves 30 and the via holes 32 includes the Cu—Zr alloy film 76' in the island-shaped structures formed in the interface between the barrier layer 34 and the adhesion layer 36, whereby the rugged surface of the island-shaped Cu—Zr alloy film 76' mechanically mesh the barrier layer 34 and the adhesion layer 36 at the interface therebetween, which makes the adhesion between the barrier layer 34 and the adhesion layer 36 sturdy. The adhesion layer 36 is formed of a material, such as Zr film or others, which has high adhesion to the barrier layer 34 and the Cu layer 38, whereby the adhesion between the Cu film 38 and the barrier layer 34 can be improved.

Thus, according to the present embodiment, even when, in the fabrication process, a force is exerted to the Cu films 38, 40, and a stress is applied between the Cu film 38 and the barrier layer 34, the peeling of the Cu films 38, 40 from the barrier layer 34 can be prevented, and the improved adhesion between the Cu film 38 and the barrier layer 34 can improve the stress migration resistance. The improved adhesion between the barrier layer 34 and the Cu film 38 depresses migration of atoms of the Cu film 38 in the interface between the Cu film 38 and the barrier layer 34, whereby the electro migration resistance can be improved.

In the present embodiment, the island-shaped structures of the Cu—Zr alloy are provided between the barrier layer and the adhesion layer of the semiconductor device according to the first embodiment, but can be provided similarly in the second to the fourth embodiments.

[A Sixth Embodiment]

The semiconductor device and the method for fabricating the same according to a sixth embodiment of the present invention will be explained with reference to FIGS. 21 and 22A–22D. The same members of the present embodiment as those of the semiconductor device and the method for fabricating the same according to the first to the fifth embodiments are represented by the same reference numbers not to repeat or to simplify their explanation.

Figure 21:
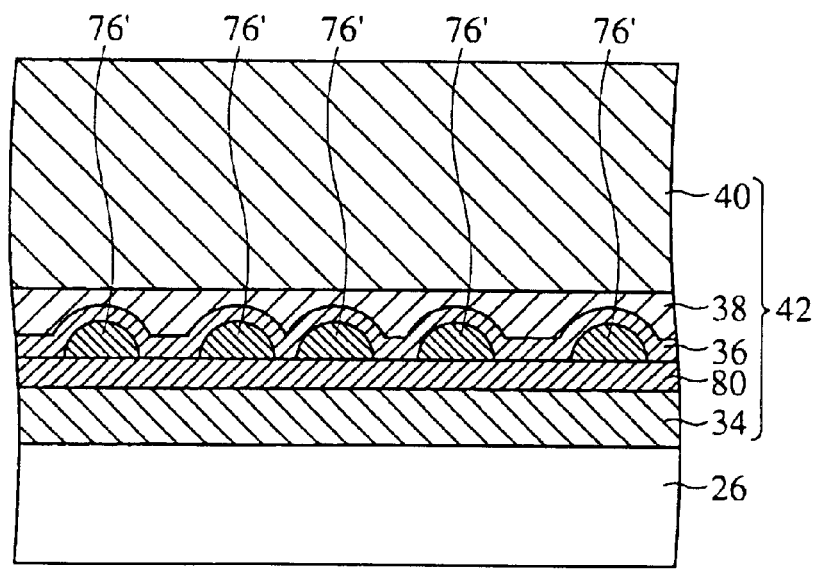
FIG. 21 is a diagrammatic sectional view of the semiconductor device according to a sixth embodiment of the present invention.

FIG. 21 is a diagrammatic sectional view of the semiconductor device according to the present embodiment, which shows a structure thereof. FIGS. 22A–22D are sectional views of the semiconductor device according to the present embodiment in the steps of the method for fabricating the same, which explain the method. FIGS. 21 and 22A–22D are enlarged sectional views of a region corresponding to the region of the semiconductor device of the first embodiment shown in FIG. 2, where the interconnection layer 42 is formed.

The semiconductor device according to the present embodiment is different from the fifth embodiment in that in the former, Zr films as adhesion layers are formed on and below the island-shaped Cu—Zr alloy film 76' explained in the fifth embodiment to enclose the island-shaped Cu—Zr alloy film 76' by the two adhesion layers, and is the same in the other respects as the fifth embodiment shown in FIG. 19.

As shown in FIG. 21, in the sixth embodiment, an adhesion layer 80 of Zr is formed on a barrier layer 34, and the Cu—Zr alloy film 76' is enclosed by the adhesion layer 80 and an adhesion layer 36. Thus, the Cu—Zr alloy film 76' mechanically meshes the adhesion layer 36 and the adhesion layer 80 with each other. A film thickness and a diameter of the island-shaped Cu—Zr alloy film 76', and a space between adjacent island-shaped structures are the same as those of the fifth embodiment.

The Zr of the adhesion layers 36, 80 is diffused in the island-shaped Cu—Zr alloy film 76' during the fabrication process which will be described later. Accordingly, the composition continuously changes in the interfaces between the adhesion layers 36, 80 and the Cu—Zr alloy film 76', and an exact interface is not present. Accordingly, the adhesion between the adhesion layers 36, 80 and the Cu—Zr alloy 76' is improved. Also in the interface between the adhesion layer 36 and the Cu film 38, similarly the Zr of the adhesion layer 36 diffuses in the Cu film 38, and the adhesion therebetween is improved. Also in the interface between the adhesion layer 80 and the barrier layer 34, the constituent elements diffuse in each other, whereby improved adhesion is also ensured here.

The micro rugged surface of the island-shaped alloy film 76' mechanically mesh the adhesion layer 36 and the adhesion layer 80 with each other, whereby the adhesion between both can be sturdy. Accordingly, even when a mechanical stress is applied to the Cu films 38, 40 by a process, such as CMP method or others, the peeling of the Cu films 38, 40 from the barrier layer 34 can be prevented. The stress migration resistance can be improved. Further, the adhesion between the Cu film 38 and the barrier layer 34 is improved, whereby migration of atoms near the interface between the Cu film 38 and the barrier layer 34 can be minimized, and the electro migration resistance can be improved.

Next, with reference to FIGS. 22A–22D, the method for forming the adhesion layer 80, the Cu—Zr alloy film 76', the adhesion layer 36, the Cu film 38 as the seed layer and the Cu film 40 will be detailed.

First, an about 5–50 nm-thick Zr film is deposited in amorphous state, covering the barrier layer 34 to form the adhesion layer 80 of the Zr film.

Figure 22A:
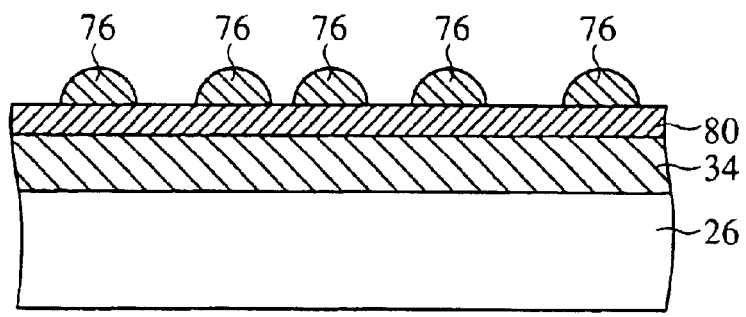
FIGS. 22A–22D are sectional views of the semiconductor device according to the sixth embodiment of the present invention in the steps of the method for fabricating the same, which explain the method.

Next, the island-shaped Cu film 76 is formed on the adhesion layer 80 (FIG. 22A). In forming the Cu film 76, the Cu film 76 is formed in an about 30 nm-thick with a silicon substrate 10 heated to 100–250° C. and by sputtering method with a vapor deposition amount controlled. Thus, the Cu film is not formed in a uniform film and formed, in a plan view, in circular island-shaped structures of an about 20 nm-diameter. In the present embodiment, a size of the island-shaped structures can be controlled corresponding to a film thickness of the adhesion layer 80. Similarly with the fifth embodiment, a temperature for heating the silicon substrate 10 is changed to change a film thickness and a diameter of the island-shaped Cu film 76. The cu film 76 may be also formed by CVD method or plating method.

Figure 22B:
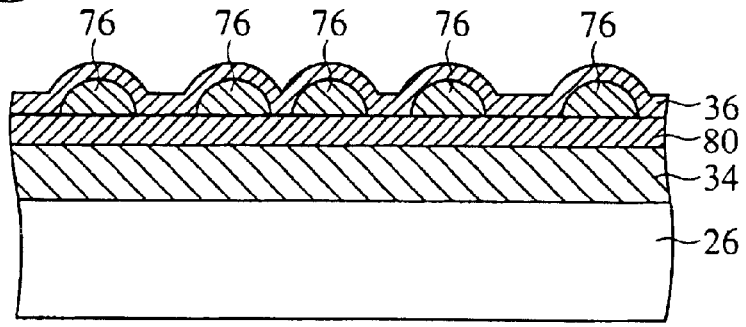

Next, an about 5–50 nm-thick Zr film is again deposited on the entire surface of the silicon substrate 10. Thus, the adhesion layer 36 of the Zr film is formed (FIG. 22B).

Figure 22C:
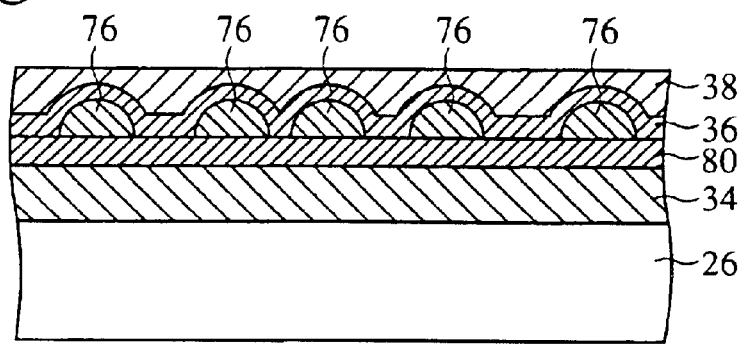

Next, the Cu film 38 as the seed layer is formed in an about 50–200 nm-thick by sputtering method, CVD method or others (FIG. 22C).

Figure 22D:
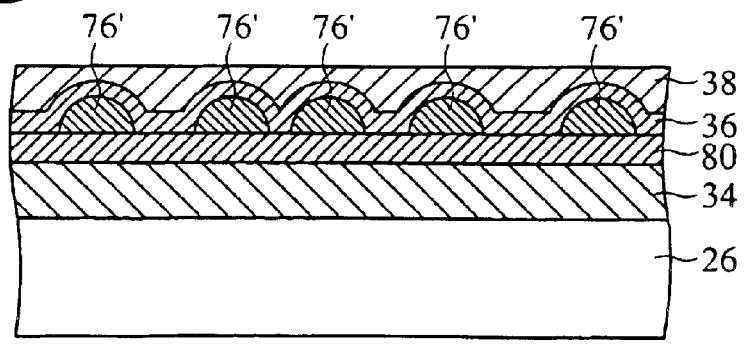

Then, after the Cu film 38 is formed, a heat treatment is made. The heat treatment is made at a lower temperature of, e.g., about 200° C. or at a temperature of, e.g., 500° C. for some second by the rapid thermal treatment. Thus, the Zr of the adhesion layer 36 and the adhesion layer 80 are diffused into the island-shaped Cu film 76 of a fine crystal structure and the Cu film 38 as the seed layer, and the Cu film 76 becomes the Cu—Zr alloy film 76' (FIG. 22D). The Zr is diffused also into the barrier layer 34, so that the constituent elements are diffused into each other near the interface between the adhesion layer 36 and the barrier layer 34. The adhesion between the adhesion layer 36 and the barrier layer 34 is improved. The island-shaped Cu—Zr alloy film 76' have rugged surface, whereby the Cu—Zr alloy film 76' mechanically meshes the adhesion layer 36 and the adhesion layer 80 with each other. The structure is reinforced against a mechanical stress.

Then, the Cu film 40 is formed by plating method with the Cu film 38 as the seed layer, and an interconnection layer 42 shown in FIG. 21 is completed.

As described above, according to the present embodiment, the adhesion layer 80 is formed on the barrier layer 34, and the island-shaped Cu—Zr alloy film 76' are formed in the interface between the adhesion layer 80 and the adhesion layer 36, whereby the rugged surface of the island-shaped Cu—Zr alloy film 76' mechanically mesh the adhesion layer 80 and the adhesion layer 36 with each other, whereby the adhesion between the adhesion layer 80 and the adhesion layer 36 can be made sturdy.

The adhesion layers 36, 80 are formed of a material, such as zirconium, having high adhesion to the barrier layer 34 and the Cu film, whereby the adhesion layer 80 first formed can have high adhesion to the barrier layer 34, and the adhesion between the Cu film 38 and the barrier layer 34 can be further improved.

Thus, according to the present embodiment, as in the fifth embodiment, even when a force is exerted to the Cu films 38, 40 in the fabrication process, and a stress is applied to the cu film 38 and the barrier layer 34, the peeling of the Cu films 38, 40 from the barrier layer 34 can be prevented, and the higher adhesion between the Cu film 38 and the barrier layer 34 can improve the stress migration resistance. The improved adhesion between the barrier layer 34 and the Cu film 38 suppresses migration of the elements of the Cu film in the interface between the Cu film 38 and the adhesion layer 36, whereby the electro migration resistance can be improved.

In the present embodiment, the island-shaped Cu—Zr alloy are provided between the barrier layer and the adhesion layer of the semiconductor device according to the first embodiment, but the island-shaped Cu—Zr alloy are also applicable to the second to the fourth embodiments.

[Modifications]

The present invention is not limited to the above-described embodiments and covers other various modifications.

For example, in the first to the sixth embodiments, the adhesion layer is formed of Zr film. However, as long as a material has low solid solubility limit in the Cu film and is not effective to increase the resistance value of Cu, the material can produce the above-described advantageous effect of the present invention. Accordingly, in place of Zr, Cd, Ag, Pb, or an alloy of them may be used. In such case, in the fifth and the sixth embodiments, the island-shaped structures are formed of an alloy of one of these metals and Cu.

In the first to the third embodiments, the barrier layer is formed of TaN. Materials other than TaN may be used. Such barrier materials which can provide good adhesion to Zr film are, e.g., Ta, Ti, W, Nb or their nitrides, refractory metal silicides, such as WSi, TiW, etc.

Figure 23:
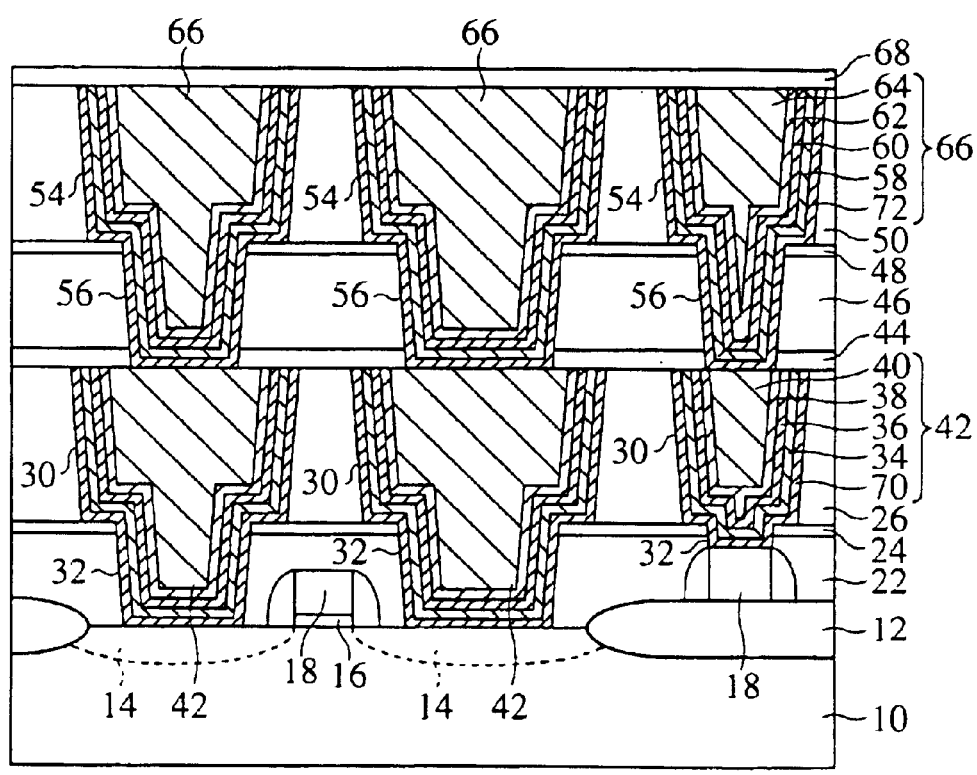
FIG. 23 is a diagrammatic sectional view of the semiconductor device according to a modification of the embodiments of the present invention, which explains the semiconductor device and the method for fabricating the same.
Figure 24A:
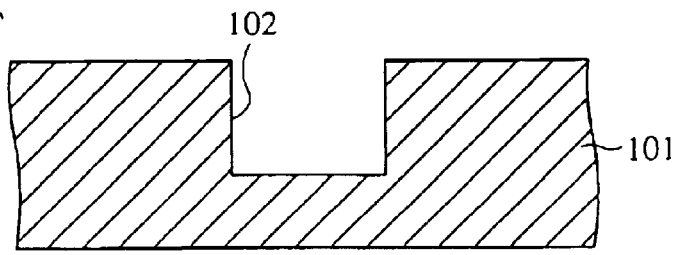
FIGS. 24A–24D are sectional views of the conventional semiconductor device in the steps of the method for fabricating the same, which explain the method.
Figure 24B:
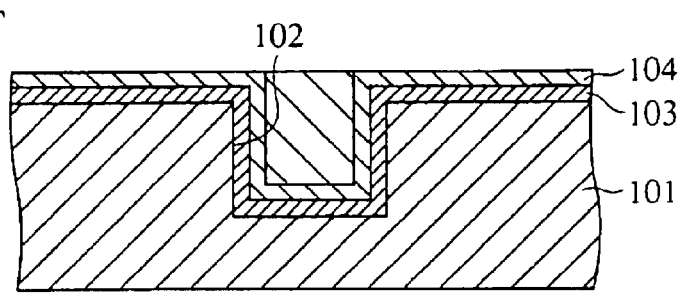
Figure 24C:
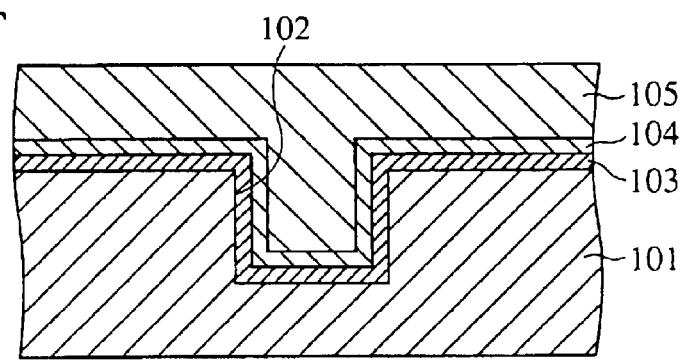
Figure 24D:
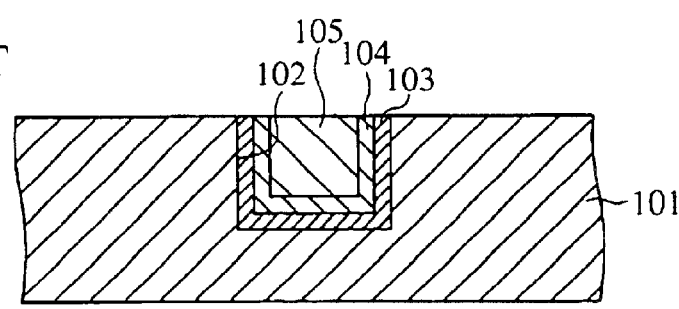

In the first, the second and the fourth embodiments, the semiconductor devices and including the adhesion layer between the barrier layer and the seed layer, and the method for fabricating the same are explained. In the third embodiment, the semiconductor device including the adhesion layer between the inter-layer insulation film and the barrier layer, and the method for fabricating the same is explained. However, as exemplified in FIG. 23, adhesion layers may be provided respectively between an inter-layer insulation film and a barrier layer, and between the barrier layer and a seed layer. That is, the interconnection layer 42 may be formed of Cu film 40/Cu film 38 as the seed layer 38/the adhesion layer 36/the barrier layer 34/the adhesion layer 70, and the interconnection layer 66 may be formed of cu film 64/Cu film 62 as the seed layer/the adhesion layer 60/the barrier layer 58/the adhesion layer 72.

In the first to the fourth embodiments, the present invention is applied to a case that the first metal interconnection layer and the second metal interconnection layer connected to the first metal interconnection layer. The present invention is applicable to upper metal interconnection layers. It is not necessary that interconnection layers of different levels have the same structure. For example, the first embodiment may be applied to the first interconnection layer, and the third embodiment may be applied to the second interconnection layer.

As described above, according to the present invention, in the semiconductor device including a buried interconnection layer of copper as a main component and a method for fabricating the semiconductor device, the adhesion layer of Zr film is formed between the seed layer and the barrier layer, whereby the adhesion between the seed layer and the barrier layer can be improved. The island-shaped structures of a Cu—Zr alloy formed between the seed layer and the barrier layer can further improve the adhesion. As a result, the peeling of the copper interconnection in the fabrication process can be prevented. The electro migration resistance and stress migration resistance of the copper interconnection can be further improved. Accordingly, the metal interconnection and the semiconductor device, and the method for forming the metal interconnection and the method for fabricating the semiconductor device can have higher yields and higher reliability.

What is claimed is:

1. A metal interconnection buried in an insulation film comprising:
    an interconnection material containing copper as a main component;
    a barrier layer formed between the insulation film and the interconnection material; and
    an adhesion layer of Zr or ZrN formed between the barrier layer and the interconnection material the adhesion layer being for improving an adhesion between the barrier layer and the interconnection material; and
    islands of a copper-zirconium alloy spaced from each other formed between the adhesion layer and the barrier layer.

2. A metal interconnection according to claim 1, wherein the islands of the copper-zirconium alloy are formed on the barrier layer, projected toward the adhesion layer and buried in the adhesion layer in mesh with the adhesion layer.

3. A semiconductor device comprising:
    a base substrate having a semiconductor substrate and a semiconductor element formed on the semiconductor substrate;
    an insulation film formed on the base substrate the insulation film having an opening; and
    a metal interconnection formed buried in the opening including:
    an interconnection material containing copper as a main component;
    a barrier layer formed between the insulation film and the interconnection material; and
    an adhesion layer containing a metal material having a solid solubility limit of not more than 20 wt% in copper and a resistivity increase of not more than 19.8% when solved in copper formed on the barrier layer and not containing copper, the adhesion layer being for improving an adhesion between the barrier layer and the interconnection material.

4. A metal interconnection according to claim 3, wherein, the metal material is comprised of at least one material selected from the group consisting of Zr, Cd, Ag and Pb.

5. A semiconductor device comprising:
    a base substrate having a semiconductor substrate and a semiconductor element formed on the semiconductor substrate;
    an insulation film formed on the base substrate, the insulation film having an opening; and
    a metal interconnection formed buried in the opening including:
    an interconnection material containing copper as a main component;
    a barrier layer formed between the insulation film and the interconnection material; and
    a first adhesion layer containing zirconium formed between the barrier layer and the interconnection material, the first adhesion layer being for improving an adhesion between the barrier layer and the interconnection material.

6. A semiconductor device according to claim 5, further comprising:
    islands of a copper-zirconium alloy spaced from each other formed between the barrier layer and the first adhesion layer.

7. A semiconductor device according to claim 6,
wherein the islands of the copper-zirconium alloy have a thickness of not more than 30 nm.

8. A semiconductor device according to claim 6,
wherein the islands of the copper-zirconium alloy have a diameter of not more than 20 nm.

9. A semiconductor device according to claim 6,
wherein the islands of the copper-zirconium alloy are spaced from each other at a space of not less than 2 nm and not more than 20 nm.

10. A semiconductor device according to claim 5, further comprising:
    islands of a copper-zirconium alloy spaced from each other formed in the first adhesion layer.

11. A semiconductor device according to claim 5,
wherein the opening includes an interconnection groove and a via hole opened in the interconnection groove.

12. A semiconductor device according to claim 5, further comprising:
    a second adhesion layer containing zirconium formed between the insulation film and the barrier layer.

13. A method for forming a metal interconnection buried in an insulation film, comprising the steps of:
    forming a barrier layer on the insulation film;
    forming an adhesion layer containing zirconium directly on the barrier layer; and
    forming an interconnection material containing copper as a main component on the adhesion layer, further comprising, after the step of forming the barrier layer, the step of forming islands of copper as a main component spaced from each other on the barrier layer.

14. A method for fabricating a semiconductor device comprising the steps of:
    forming an insulation film on the base substrate having a semiconductor substrate and a semiconductor element formed on the semiconductor substrate;
    selectively removing the insulation film to form an opening in the insulation film;
    forming a barrier layer on the insulation film and a region where the opening is formed;
    forming a first adhesion layer containing zirconium directly on the barrier layer;

forming an interconnection material containing copper as a main component on the first adhesion layer so as to fill the opening; and removing the interconnection material, the first adhesion layer and the barrier layer by polishing the same until the insulation film is exposed to form the metal interconnection of the interconnection material, the first adhesion layer and the barrier layer buried in the opening.

15. A method for fabricating a semiconductor device according to claim 14, further comprising, after the step of forming the barrier layer, the step of forming islands of copper as a main component spaced from each other on the barrier layer.

16. A method for fabricating a semiconductor device according to claim 15, further comprising, before the step of forming the islands, the step of forming the second adhesion layer containing zirconium on the barrier layer.

17. A method for fabricating a semiconductor device according to claim 15, further comprising the steps of:

forming a seed layer of copper as a main component on the adhesion layer; and subjecting the semiconductor substrate to a heat treatment to diffuse the zirconium in the adhesion layer into the seed layer and the islands.

18. A method for fabricating a semiconductor device according to claim 15, wherein in the step of forming islands, the islands are formed in a thickness of not more than 30 nm.

19. A method for fabricating a semiconductor device according to claim 15, wherein in the step of forming islands, the islands are formed in a diameter of not more than 20 nm.

20. A method for fabricating a semiconductor device according to claim 15, wherein in the step of forming islands, the islands are formed, spaced from each other by a space of not less than 2 nm and not more than 20 nm.

21. A method for fabricating a semiconductor device according to claim 14, further comprising the steps of:

forming a seed layer of copper as a main component on the adhesion layer; and subjecting the semiconductor substrate to a heat treatment to diffuse zirconium in the adhesion layer into the seed layer.

22. A method for fabricating a semiconductor device according to claim 14, further comprising, before the step of forming the barrier layer, the step of forming a second adhesion layer containing zirconium on the insulation film.

* * * * *